US011611219B2

(12) United States Patent
McNamara et al.

(10) Patent No.: US 11,611,219 B2
(45) Date of Patent: *Mar. 21, 2023

(54) SYSTEM OF CRITICAL DATACENTERS AND BEHIND-THE-METER FLEXIBLE DATACENTERS

(71) Applicant: LANCIUM LLC, Houston, TX (US)

(72) Inventors: Michael T. McNamara, Newport Beach, CA (US); David J. Henson, Houston, TX (US); Raymond E. Cline, Jr., Houston, TX (US)

(73) Assignee: LANCIUM LLC, Houston, TX (US)

( * ) Notice: Subject to any disclaimer, the term of this patent is extended or adjusted under 35 U.S.C. 154(b) by 3 days.

This patent is subject to a terminal disclaimer.

(21) Appl. No.: 17/340,664

(22) Filed: Jun. 7, 2021

(65) Prior Publication Data

US 2021/0296893 A1 Sep. 23, 2021

Related U.S. Application Data

(63) Continuation of application No. 16/132,062, filed on Sep. 14, 2018, now Pat. No. 11,031,787.

(51) Int. Cl.
*H02J 3/38* (2006.01)
*G06F 1/28* (2006.01)
(Continued)

(52) U.S. Cl.
CPC ............ *H02J 3/386* (2013.01); *G05B 13/041* (2013.01); *G06F 1/28* (2013.01); *H02J 3/00* (2013.01);
(Continued)

(58) Field of Classification Search
CPC . G05B 13/041; G06F 1/16; G06F 1/28; H02J 13/00004; H02J 13/00016;
(Continued)

(56) References Cited

U.S. PATENT DOCUMENTS 5,142,672 A 8/1992 Johnson et al.
5,367,669 A 11/1994 Holland et al.
(Continued)

FOREIGN PATENT DOCUMENTS

CN 101803148 A 8/2010
CN 102185382 A 9/2011
(Continued)

OTHER PUBLICATIONS

Advisory Action dated Nov. 13, 2020 for U.S. Appl. No. 16/529,360, filed Aug. 1, 2019, 182 pages.
(Continued)

*Primary Examiner* — Kidest Bahta
(74) *Attorney, Agent, or Firm* — Barnes & Thornburg LLP

(57) ABSTRACT

Systems include one or more critical datacenter connected to behind-the-meter flexible datacenters. The critical datacenter is powered by grid power and not necessarily collocated with the flexboxes, which are powered "behind the meter." When a computational operation to be performed at the critical datacenter is identified and determined that it can be performed at a lower cost at a flexible datacenter, the computational operation is instead routed to the flexible datacenters for performance. The critical datacenter and flexible datacenters preferably shared a dedicated communication pathway to enable high-bandwidth, low-latency, secure data transmissions.

20 Claims, 14 Drawing Sheets

(51) Int. Cl.
*H02J 13/00* (2006.01)
*G05B 13/04* (2006.01)
*H02J 3/00* (2006.01)
*H02J 3/14* (2006.01)
*H02J 3/06* (2006.01)

(52) U.S. Cl.
CPC ............... *H02J 3/003* (2020.01); *H02J 3/06* (2013.01); *H02J 3/144* (2020.01); *H02J 3/38* (2013.01); *H02J 3/383* (2013.01); *H02J 13/0006* (2013.01); *H02J 13/00016* (2020.01); *H02J 13/00034* (2020.01); *H02J 3/001* (2020.01); *H02J 2203/10* (2020.01)

(58) Field of Classification Search
CPC ............. H02J 13/00034; H02J 13/0006; H02J 2203/10; H02J 2300/24; H02J 2300/28; H02J 2310/16; H02J 2310/64; H02J 3/00; H02J 3/001; H02J 3/003; H02J 3/06; H02J 3/14; H02J 3/144; H02J 3/38; H02J 3/381; H02J 3/383; H02J 3/386; H05K 7/1497; H05K 7/1498; Y02B 70/3225; Y02E 10/56; Y02E 10/76; Y02E 60/00; Y04S 20/222; Y04S 40/124
See application file for complete search history.

(56) References Cited

U.S. PATENT DOCUMENTS

| | | |
|---|---|---|
| 5,913,046 A | 6/1999 | Barth et al. |
| 6,288,456 B1 | 9/2001 | Cratty |
| 6,633,823 B2 | 10/2003 | Bartone et al. |
| 6,748,932 B1 | 6/2004 | Sorter et al. |
| 7,143,300 B2 | 11/2006 | Potter et al. |
| 7,278,273 B1 | 10/2007 | Whitted et al. |
| 7,376,851 B2 | 5/2008 | Kim |
| 7,647,516 B2 | 1/2010 | Ranganathan et al. |
| 7,702,931 B2 | 4/2010 | Goodrum et al. |
| 7,779,276 B2 | 8/2010 | Bolan et al. |
| 7,861,102 B1 | 12/2010 | Ranganathan et al. |
| 7,921,315 B2 | 4/2011 | Langgood et al. |
| 7,970,561 B2 | 6/2011 | Pfeiffer |
| 8,001,403 B2 | 8/2011 | Hamilton et al. |
| 8,006,108 B2 | 8/2011 | Brey et al. |
| 8,214,843 B2 | 7/2012 | Boss et al. |
| 8,260,913 B2 | 9/2012 | Knapp et al. |
| 8,374,928 B2 | 2/2013 | Gopisetty et al. |
| 8,447,993 B2 | 5/2013 | Greene et al. |
| 8,571,820 B2 | 10/2013 | Pfeiffer |
| 8,627,123 B2 | 1/2014 | Jain et al. |
| 8,639,392 B2 | 1/2014 | Chassin |
| 8,700,929 B1 | 4/2014 | Weber et al. |
| 8,706,915 B2 | 4/2014 | Duchesneau |
| 8,719,223 B2 | 5/2014 | Knapp et al. |
| 8,789,061 B2 | 7/2014 | Pavel et al. |
| 8,799,690 B2 | 8/2014 | Dawson et al. |
| 8,839,551 B2 | 9/2014 | Swann |
| 9,003,211 B2 | 4/2015 | Pfeiffer |
| 9,003,216 B2 | 4/2015 | Sankar et al. |
| 9,026,814 B2 | 5/2015 | Aasheim et al. |
| 9,027,024 B2 | 5/2015 | Mick et al. |
| 9,143,392 B2 | 9/2015 | Duchesneau |
| 9,207,993 B2 | 12/2015 | Jain |
| 9,218,035 B2 | 12/2015 | Li et al. |
| 9,252,598 B2 | 2/2016 | Belady et al. |
| 9,282,022 B2 | 3/2016 | Matthews et al. |
| 9,416,904 B2 | 8/2016 | Belady et al. |
| 9,542,231 B2 | 1/2017 | Khan et al. |
| 9,552,234 B2 | 1/2017 | Boldyrev et al. |
| 9,618,991 B1 | 4/2017 | Clidaras et al. |
| 9,645,596 B1 | 5/2017 | Lee et al. |
| 9,994,118 B2 | 6/2018 | Williams et al. |
| 10,033,210 B2 | 7/2018 | Peterson et al. |
| 10,250,039 B2 | 4/2019 | Wenzel et al. |
| 10,340,696 B2 | 7/2019 | Paine et al. |
| 10,367,353 B1 | 7/2019 | McNamara et al. |
| 10,367,535 B2 | 7/2019 | Corse et al. |
| 10,444,818 B1 | 10/2019 | McNamara et al. |
| 10,452,127 B1 | 10/2019 | McNamara et al. |
| 10,452,532 B2 | 10/2019 | McVay et al. |
| 10,497,072 B2 | 12/2019 | Hooshmand et al. |
| 10,608,433 B1 | 3/2020 | McNamara et al. |
| 10,618,427 B1 | 4/2020 | McNamara et al. |
| 10,637,353 B2 | 4/2020 | Ohyama et al. |
| 10,709,076 B2 | 7/2020 | Pham |
| 10,795,428 B2 | 10/2020 | Walsh |
| 10,822,992 B2 | 11/2020 | Spears |
| 10,862,307 B2 | 12/2020 | Cavness et al. |
| 10,873,211 B2 | 12/2020 | McNamara et al. |
| 10,931,117 B2 | 2/2021 | Shoemaker |
| 11,016,456 B2 | 5/2021 | Henson et al. |
| 11,016,458 B2 | 5/2021 | McNamara et al. |
| 11,016,553 B2 | 5/2021 | McNamara et al. |
| 11,025,060 B2 | 6/2021 | McNamara et al. |
| 11,031,787 B2 | 6/2021 | McNamara et al. |
| 11,031,813 B2 | 6/2021 | McNamara et al. |
| 11,042,948 B1 | 6/2021 | McNamara et al. |
| 11,128,165 B2 | 9/2021 | McNamara et al. |
| 11,537,183 B2 | 12/2022 | Lewis et al. |
| 2002/0158749 A1 | 10/2002 | Ikeda et al. |
| 2003/0037150 A1 | 2/2003 | Nakagawa |
| 2003/0074464 A1 | 4/2003 | Bohrer et al. |
| 2004/0117330 A1 | 6/2004 | Ehlers et al. |
| 2005/0005528 A1 | 1/2005 | Brault et al. |
| 2005/0034128 A1 | 2/2005 | Nagashima et al. |
| 2005/0203761 A1 | 9/2005 | Barr et al. |
| 2006/0059772 A1 | 3/2006 | Brault et al. |
| 2006/0161765 A1 | 7/2006 | Cromer et al. |
| 2006/0253675 A1 | 11/2006 | Johannes Bloks |
| 2007/0067657 A1 | 3/2007 | Ranganathan et al. |
| 2007/0228837 A1 | 10/2007 | Nielsen et al. |
| 2008/0000151 A1 | 1/2008 | Houweling et al. |
| 2008/0030078 A1 | 2/2008 | Whitted et al. |
| 2008/0094797 A1 | 4/2008 | Coglitore et al. |
| 2008/0238195 A1 | 10/2008 | Shaver et al. |
| 2009/0012523 A1 | 1/2009 | Ruuttu et al. |
| 2009/0055665 A1 | 2/2009 | Maglione et al. |
| 2009/0070611 A1 | 3/2009 | Bower, III et al. |
| 2009/0078401 A1 | 3/2009 | Cichanowicz |
| 2009/0089595 A1 | 4/2009 | Brey et al. |
| 2009/0216910 A1 | 8/2009 | Duchesneau |
| 2009/0235097 A1 | 9/2009 | Hamilton et al. |
| 2010/0058350 A1 | 3/2010 | Boss et al. |
| 2010/0211810 A1 | 8/2010 | Zacho |
| 2010/0235004 A1 | 9/2010 | Thind |
| 2010/0280675 A1 | 11/2010 | Tate, Jr. et al. |
| 2010/0328849 A1 | 12/2010 | Ewing et al. |
| 2010/0333113 A1 | 12/2010 | Johnson et al. |
| 2011/0072289 A1 | 3/2011 | Kato |
| 2011/0282982 A1 | 11/2011 | Jain |
| 2012/0000121 A1 | 1/2012 | Swann |
| 2012/0032665 A1 | 2/2012 | Shaver, II et al. |
| 2012/0072745 A1 | 3/2012 | Ahluwalia et al. |
| 2012/0109705 A1 | 5/2012 | Belady et al. |
| 2012/0300524 A1 | 11/2012 | Fornage et al. |
| 2012/0306271 A1 | 12/2012 | Kuriyama |
| 2012/0321309 A1 | 12/2012 | Barry et al. |
| 2012/0326511 A1 | 12/2012 | Johnson |
| 2013/0006401 A1 | 1/2013 | Shan |
| 2013/0054987 A1 | 2/2013 | Pfeiffer et al. |
| 2013/0063991 A1 | 3/2013 | Xiao et al. |
| 2013/0111494 A1 | 5/2013 | Hyser et al. |
| 2013/0117621 A1 | 5/2013 | Saraiya et al. |
| 2013/0187464 A1 | 7/2013 | Smith et al. |
| 2013/0227139 A1 | 8/2013 | Suffling |
| 2013/0328395 A1 | 12/2013 | Krizman et al. |
| 2014/0070756 A1 | 3/2014 | Kearns et al. |
| 2014/0137468 A1 | 5/2014 | Ching |
| 2014/0150336 A1 | 6/2014 | Houweling |
| 2014/0180886 A1 | 6/2014 | Forbes, Jr. |
| 2014/0365402 A1 | 12/2014 | Belady et al. |
| 2014/0379156 A1 | 12/2014 | Kamel et al. |

(56) References Cited

U.S. PATENT DOCUMENTS

| | | |
|---|---|---|
| 2015/0012113 A1 | 1/2015 | Celebi |
| 2015/0121113 A1 | 4/2015 | Ramamurthy et al. |
| 2015/0155712 A1 | 6/2015 | Mondal |
| 2015/0212122 A1 | 7/2015 | Sobotka et al. |
| 2015/0229227 A1 | 8/2015 | Aeloiza et al. |
| 2015/0277410 A1 | 10/2015 | Gupta et al. |
| 2015/0278968 A1 | 10/2015 | Steven et al. |
| 2015/0278969 A1 | 10/2015 | Benoy et al. |
| 2015/0280492 A1 | 10/2015 | Narita |
| 2015/0288183 A1 | 10/2015 | Villanueva, Jr. et al. |
| 2015/0372538 A1 | 12/2015 | Siegler et al. |
| 2016/0006066 A1 | 1/2016 | Robertson |
| 2016/0011617 A1 | 1/2016 | Liu et al. |
| 2016/0013652 A1 | 1/2016 | Li et al. |
| 2016/0043552 A1 | 2/2016 | Villanueva, Jr. et al. |
| 2016/0087909 A1 | 3/2016 | Chatterjee et al. |
| 2016/0126783 A1 | 5/2016 | Cheng et al. |
| 2016/0170469 A1 | 6/2016 | Sehgal et al. |
| 2016/0172900 A1 | 6/2016 | Welch, Jr. |
| 2016/0187906 A1 | 6/2016 | Bodas et al. |
| 2016/0198656 A1 | 7/2016 | McNamara et al. |
| 2016/0202744 A1 | 7/2016 | Castro-Leon |
| 2016/0212954 A1 | 7/2016 | Argento |
| 2016/0248631 A1 | 8/2016 | Duchesneau |
| 2016/0261226 A1 | 9/2016 | Hamilton et al. |
| 2016/0324077 A1 | 11/2016 | Frantzen et al. |
| 2016/0377306 A1 | 12/2016 | Drees et al. |
| 2017/0023969 A1 | 1/2017 | Shows et al. |
| 2017/0104332 A1 | 4/2017 | Wenzel et al. |
| 2017/0104336 A1 | 4/2017 | Elbsat et al. |
| 2017/0104337 A1 | 4/2017 | Drees |
| 2017/0104342 A1 | 4/2017 | Eibsat et al. |
| 2017/0104343 A1 | 4/2017 | Eibsat et al. |
| 2017/0192483 A1 | 7/2017 | Boss et al. |
| 2017/0194791 A1 | 7/2017 | Budde |
| 2017/0201098 A1 | 7/2017 | Carpenter |
| 2017/0214070 A1 | 7/2017 | Wang et al. |
| 2017/0237261 A1 | 8/2017 | Maug et al. |
| 2017/0261949 A1 | 9/2017 | Hoffmann et al. |
| 2017/0373500 A1 | 12/2017 | Shafi et al. |
| 2018/0026478 A1 | 1/2018 | Peloso |
| 2018/0052431 A1 | 2/2018 | Shaikh et al. |
| 2018/0116070 A1 | 4/2018 | Broadbent et al. |
| 2018/0144414 A1 | 5/2018 | Lee et al. |
| 2018/0202825 A1 | 7/2018 | You et al. |
| 2018/0240112 A1 | 8/2018 | Castinado et al. |
| 2018/0267839 A1* | 9/2018 | Maisuria ............... G06F 1/3228 |
| 2018/0294649 A1 | 10/2018 | Bright et al. |
| 2018/0366978 A1 | 12/2018 | Matan et al. |
| 2018/0367320 A1 | 12/2018 | Montalvo |
| 2019/0052094 A1 | 2/2019 | Pmsvvsv et al. |
| 2019/0082618 A1 | 3/2019 | Lopez |
| 2019/0168630 A1 | 6/2019 | Mrlik et al. |
| 2019/0258307 A1 | 8/2019 | Shaikh et al. |
| 2019/0261589 A1 | 8/2019 | Pham |
| 2019/0280521 A1 | 9/2019 | Lundstrom et al. |
| 2019/0318327 A1 | 10/2019 | Sowell et al. |
| 2019/0324820 A1 | 10/2019 | Krishnan et al. |
| 2019/0339756 A1 | 11/2019 | Lewis et al. |
| 2020/0040272 A1 | 2/2020 | Cavness et al. |
| 2020/0051184 A1 | 2/2020 | Barbour |
| 2020/0073466 A1 | 3/2020 | Walsh |
| 2020/0089307 A1 | 3/2020 | McNamara et al. |
| 2020/0136387 A1 | 4/2020 | McNamara et al. |
| 2020/0136388 A1 | 4/2020 | McNamara et al. |
| 2020/0167197 A1 | 5/2020 | Bahramshahry et al. |
| 2020/0177100 A1 | 6/2020 | Wang et al. |
| 2020/0318843 A1 | 10/2020 | Wenzel et al. |
| 2020/0321776 A1 | 10/2020 | Shaver, II et al. |
| 2020/0379537 A1 | 12/2020 | Henson et al. |
| 2021/0021135 A1 | 1/2021 | Eibsat et al. |
| 2021/0175710 A1 | 6/2021 | Campbell et al. |
| 2021/0287309 A1 | 9/2021 | Gebhardt et al. |
| 2021/0298195 A1 | 9/2021 | Barbour |
| 2022/0039333 A1 | 2/2022 | Avila |

FOREIGN PATENT DOCUMENTS

| | | |
|---|---|---|
| CN | 102591921 A | 7/2012 |
| CN | 103163904 A | 6/2013 |
| CN | 103748757 A | 4/2014 |
| CN | 104144183 A | 11/2014 |
| CN | 104969434 A | 10/2015 |
| CN | 106226718 A | 12/2016 |
| CN | 107967536 A | 4/2018 |
| EP | 3850462 A1 | 7/2021 |
| KR | 20090012523 A | 2/2009 |
| WO | WO-2008039773 A2 | 4/2008 |
| WO | WO-2014005156 A2 | 1/2014 |
| WO | WO-2015039122 A1 | 3/2015 |
| WO | WO-2015199629 A1 | 12/2015 |
| WO | WO-2017163126 A1 | 9/2017 |
| WO | WO-2018068042 A1 | 4/2018 |
| WO | WO2019/060180 | 3/2019 |
| WO | WO-2019116375 A1 | 6/2019 |
| WO | WO-2019139632 A1 | 7/2019 |
| WO | WO-2019139633 A1 | 7/2019 |
| WO | WO-2020056322 A1 | 3/2020 |
| WO | WO-2020227811 A1 | 11/2020 |
| WO | WO-2022031836 A1 | 2/2022 |

OTHER PUBLICATIONS

Advisory Action dated Oct. 22, 2020 for U.S. Appl. No. 16/528,348, filed Jul. 31, 2019, 3 pages.

Bakar et al., "Microgrid and Load Shedding Scheme During Islanded Mode: a Review," Elsevier, May 26, 2020, vol. 71, pp. 161-169. https://www.sciencedirect.com/science/article/pii/S1364032116311030.

Bird et al., "Wind and Solar Energy Curtailment: Experience and Practices in the United States," National Renewable Energy Lab (NREL), Technical Report NREL/TP-6A20-60983, Mar. 2014, 58 pages.

Choi et al., "Optimal Load Shedding for Maximizing Satisfaction in an Islanded Microgrid," Energies, 2017, vol. 10, p. 45, doi: 10.3390/en10010045.

Epex Spot, "How They Occur, What They Mean," 2018, 2 pages. Retrieved from Internet:[URL:https://wwwepexspot.com/en/company-info/basics_of_the_power_market/negative_prices].

Final Office Action dated Jul. 23, 2020 on for U.S. Appl. No. 16/132,062, filed Sep. 14, 2018, 26 pages.

Final Office Action dated May 19, 2020 for U.S. Appl. No. 16/809,111, filed Mar. 4, 2020, 36 pages.

Final Office Action dated Jun. 3, 2020 for U.S. Appl. No. 16/528,348, filed Jul. 31, 2019, 33 pages.

Final Office Action dated May 28, 2020 for U.S. Appl. No. 16/132,098, filed Sep. 14, 2018, 24 pages.

Final Office Action dated Oct. 1, 2019 for U.S. Appl. No. 16/175,246, filed Oct. 30, 2018, 18 pages.

Final Office Action dated Apr. 17, 2020 for U.S. Appl. No. 16/529,402, filed Aug. 1, 2019, 59 pages.

Final Office Action dated Jul. 29, 2020 for U.S. Appl. No. 16/132,092, filed Sep. 14, 2018, 5 pages.

Gao et al., "Dynamic Load Shedding for an Islanded Microgrid With Limited Generation Resources," IET Generation, Transmission & Distribution, Sep. 2016, vol. 10(12), pp. 2953-2961. doi: 10.1049/iet-gtd.2015.1452.

Ghamkhari et al., "Optimal Integration of Renewable Energy Resources in Data Centers with Behind-the-Meter Renewable Generator," Department of Electrical and Computer Engineering Texas Tech University, 2012, pp. 3340-3444.

Hayes, Adam S., "A Cost of Production Model for Bitcoin," Department of Economics, The New School for Social Research, Mar. 2015, 5 pages.

International Search Report and Written Opinion of PCT Application No. PCT/US2018/017955, dated Apr. 30, 2018, 22 pages.

<iframe class="ginger-extension-definitionpopup" Src="chrome-extension://kdfieneakcjfaiglcfcgkidlkmlijjnh/content/popups/definitionPopup/index.html?title=filed &description=record%20in%

(56) References Cited

OTHER PUBLICATIONS

20a%20public%20office%20or%20in%20a%20court%20of%20law"style="left: 396px; top:-116px; z-index: 100001; display: none;"></iframe>.

International Search Report and Written Opinion of PCT Application No. PCT/US2018/017950, dated May 31, 2018, 15 pages.
International Search Report and Written Opinion of PCT Application No. PCT/US2020/044536, dated Aug. 26, 2020, 24 pages.
International Search Report and Written Opinion of PCT Application No. PCT/US2020/044539, dated Aug. 26, 2020, 7 pages.
International Search Report and Written Opinion of PCT Application No. PCT/US2021/019875, dated Apr. 29, 2021, 12 pages.
International Search Report and Written Opinion of PCT Application No. PCT/US20/57686, dated Feb. 22, 2021, 67 pages.
Iso, "Distributed Energy Resources Roadmap for New York's Wholesale Electricity Markets," Distributed Energy Resource Roadmap, Jan. 2017, pp. 1-39. [retrieved on Dec. 15, 2020], Retrieved from the Internet:<url:<a=""href="https://www.nyiso.com/documents/20142/1391862/Distributed_Energy_Resources_Roadmap.pdf/ec0b3b64-4de2-73e0-ffef-49a4b8b1">https://www.nyiso.com/documents/20142/1391862/Distributed_Energy_Resources_Roadmap.pdf/ec0b3b64-4de2-73e0-ffef-49a4b8b1 b3ca.</url:>.
John, "Stem and CPower to Combine Behind-the-Meter Batteries and Demand Response," Energy Storage, Aug. 8, 2017, 5 pages.
Kewl, "Start-Up From the Heart of Berlin Has Pioneered Decentralized Mobile Mining by Combining Blockchain With Regenerative Energy" Nov. 2017, 3 pages pdf http://www.crypto-news.net/start-up-from-the-heart-of-berlin-has-pioneered-decentralized-mobile-mining-by-combining-blockchain-with-regenerative-energy/ (Year: 2017).
Lim et al., "Distributed Load-shedding System for Agent-based Autonomous Microgrid Operations," Energies, 2014, vol. 7(1), pp. 385-401. doi: 10.3390/en7010385.
Liu et al., "Improved Average Consensus Algorithm Based Distributed Cost Optimization for Loading Shedding of Autonomous Microgrids," International Journal of Electrical Power & Energy Systems, Dec. 2015, vol. 73, pp. 89-96. doi: 10.1016/j.ijepes.2015.04.006.
McNamara et al., U.S. Appl. No. 16/175,246, dated Oct. 30, 2018, 64 pages.
Mousavizadeh et al., "A Linear Two-stage Method for Resiliency Analysis in Distribution Systems Considering Renewable Energy and Demand Response Resources," Elsevier, 2017, pp. 443-460. doi: 10.1016/j.apenergy.2017.11.067.
Non-Final Office Action dated Dec. 5, 2019 for U.S. Appl. No. 16/529,360, filed Aug. 1, 2019, 72 pages.
Non-Final Office Action dated Dec. 10, 2019 for U.S. Appl. No. 16/596,190, filed Oct. 8, 2019, 72 pages.
Non-Final Office Action dated Jun. 12, 2020 for U.S. Appl. No. 16/803,109, filed Dec. 27, 2020, 31 pages.
Non-Final Office Action dated Nov. 14, 2019 for U.S. Appl. No. 16/132,098, filed Sep. 14, 2018, 25 pages.
Non-Final Office Action dated Feb. 20, 2020 for U.S. Appl. No. 16/702,894, filed Dec. 4, 2019, 30 pages.
Non-Final Office Action dated Nov. 21, 2019 for U.S. Appl. No. 16/529,402, filed Aug. 1, 2019, 57 pages.
Non-Final Office Action dated Feb. 4, 2021 on for U.S. Appl. No. 16/284,610, filed Feb. 25, 2019, 9 pages.
Non-Final Office Action dated Apr. 1, 2021 on for U.S. Appl. No. 16/482,495, filed Jul. 31, 2019, 59 pages.
Non-Final Office Action dated Apr. 2, 2020 on for U.S. Appl. No. 16/132,011, filed Sep. 14, 2018, 5 pages.
Non-Final Office Action dated Mar. 8, 2021 on for U.S. Appl. No. 16/525,142, filed Jul. 29, 2019, 71 pages.
Non-Final Office Action dated Dec. 11, 2019 on for U.S. Appl. No. 16/132,062, filed Sep. 14, 2018, 17 pages.
Non-Final Office Action dated Feb. 12, 2021 on for U.S. Appl. No. 16/528,348, filed Jul. 31, 2019, 54 pages.
Non-Final Office Action dated May 14, 2020 on for U.S. Appl. No. 16/834,987, filed Mar. 30, 2020, 30 pages.
Non-Final Office Action dated Mar. 25, 2021 on for U.S. Appl. No. 16/573,577, filed Sep. 17, 2019, 65 pages.
Non-Final Office Action dated Dec. 10, 2019 for U.S. Appl. No. 16/528,348, filed Jul. 31, 2019, 33 pages.
Non-Final Office Action dated May 11, 2021 for U.S. Appl. No. 16/529,360, filed Aug. 1, 2019, 64 pages.
Non-Final Office Action dated May 28, 2021 for U.S. Appl. No. 16/658,983, filed Oct. 21, 2019, 21 pages.
Non-Final Office Action dated Mar. 30, 2020 for U.S. Appl. No. 16/132,092, filed Sep. 14, 2018, 46 pages.
Notice of Allowance dated May 12, 2021 on for U.S. Appl. No. 16/132,062, filed Sep. 14, 2018, 2 pages.
Notice of Allowance dated Oct. 13, 2020 on for U.S. Appl. No. 16/132,098, filed Sep. 14, 2018, 5 pages.
Notice of Allowance dated Jun. 12, 2020 on for U.S. Appl. No. 16/834,987, filed Mar. 30, 2020, 9 pages.
Notice of Allowance dated Jun. 9, 2021 for U.S. Appl. No. 16/528,348, filed Jul. 31, 2019, 11 pages.
Notice of Allowance dated Feb. 8, 2021 on for U.S. Appl. No. 16/132,062, filed Sep. 14, 2018, 21 pages.
Notice of Allowance dated Feb. 8, 2021 on for U.S. Appl. No. 16/803,109, filed Feb. 27, 2020, 29 pages.
Notice of Allowance dated Feb. 8, 2021 on for U.S. Appl. No. 16/834,987, filed Mar. 30, 2020, 180 pages.
Notice of Allowance dated Jan. 13, 2021 on for U.S. Appl. No. 16/175,246, filed Oct. 30, 2018, 5 pages.
Notice of Allowance dated Sep. 17, 2020 on for U.S. Appl. No. 16/175,246, filed Oct. 30, 2018, 5 pages.
Notice of Allowance dated Nov. 19, 2020 on for U.S. Appl. No. 16/132,062, filed Sep. 14, 2018, 7 pages.
Notice of Allowance dated Apr. 20, 2021 on for U.S. Appl. No. 16/482,495, filed Jul. 31, 2019, 5 pages.
Notice of Allowance dated Jan. 25, 2021 on for U.S. Appl. No. 16/132,098, filed Sep. 14, 2018, 5 pages.
Notice of Allowance dated Jan. 25, 2021 on for U.S. Appl. No. 16/702,894, filed Dec. 4, 2019, 24 pages.
Notice of Allowance dated Jan. 27, 2021 on for U.S. Appl. No. 16/132,092, filed Sep. 14, 2018, 8 pages.
Notice of Allowance dated May 27, 2021 on for U.S. Appl. No. 16/284,610, filed Feb. 25, 2019, 16 pages.
Notice of Allowance dated Jul. 29, 2020 on for U.S. Appl. No. 16/132,011, filed Sep. 14, 2018, 5 pages.
Notice of Allowance dated Oct. 29, 2020 on for U.S. Appl. No. 16/132,092, filed Sep. 14, 2018, 8 pages.
Notice of Allowance dated Apr. 2, 2019, for U.S. Appl. No. 16/175,335, filed Oct. 30, 2018, 12 pages.
Notice of Allowance dated Mar. 2, 2020, for U.S. Appl. No. 16/596,190, filed Oct. 8, 2019, 15 pages.
Notice of Allowance dated Apr. 6, 2020, for U.S. Appl. No. 16/175,246, filed Oct. 30, 2018, 12 pages.
Notice of Allowance dated Aug. 15, 2019, for U.S. Appl. No. 16/175,146, filed Oct. 30, 2018, 17 pages.
Notice of Allowance dated Jan. 27, 2020, for U.S. Appl. No. 16/702,931, filed Dec. 4, 2019, 23 pages.
Notice of Allowance dated Jul. 29, 2019, for U.S. Appl. No. 16/245,532, filed Jan. 11, 2019, 13 pages.
Pashajavid et al., "A Multimode Supervisory Control Scheme for Coupling Remote Droop-Regulated Microgrids," IEEE Transactions on Smart Grid, May 26, 2020, vol. 9(5), pp. 5381-5392. https://ieeexplore.ieee.org/abstract/document/7888570/.
Pashajavid et al., "Frequency Support for Remote Microgrid Systems With Intermittent Distributed Energy Resources—A Two-level Hierarchical Strategy," IEEE Systems Journal, May 26, 2020, vol. 12(3), pp. 2760-2771. https://ieeexplore.ieee.org/abstract/document/7862156/.
Rahimi, Farrokh, "Using a Transactive Energy Framework," IEEE Electrification Magazine, Dec. 2016, pp. 23-29.
Rudez and Mihalic, "Predictive Underfrequency Load Shedding Scheme for Islanded Power Systems With Renewable Generation," Electric Power Systems Research, May 2015, vol. 126, pp. 21-28. doi: 10.1016/j.epsr.2015.04.017.
Soluna., "Powering the Block Chain," Aug. 2018, version 1.1, 29 pages.

(56) References Cited

OTHER PUBLICATIONS

Wilson, Joseph Nathanael, "A Utility-Scale Deployment Project of Behind-the-Meter Energy Storage for Use in Ancillary Services, Energy Resiliency, Grid Infrastructure Investment Deferment, and Demand-Response Integration," Portland State University, 2016, 154 pages.
Xu et al., "Distributed Load Shedding for Microgrid With Compensation Support via Wireless Network," IET Generation, Transmission & Distribution, May 2018, vol. 12(9), pp. 2006-2018. doi: 10.1049/iet-gtd.2017.1029.
Zhou et al., "Two-Stage Load Shedding for Secondary Control in Hierarchical Operation of Islanded Microgrids," IEEE Transactions on Smart Grid, May 2019, vol. 10(3), pp. 3103-3111. doi: 10.1109/TSG.2018.2817738.
European Patent Application No. 18900411.2, Extended European Search Report dated Dec. 13, 2021.
European Patent Application No. 19858812.1, Extended European Search Report dated May 2, 2022.
European Patent Application No. 19861222.8, Extended European Search Report dated May 2, 2022.
European Patent Application No. 19861223.6, Extended European Search Report dated Apr. 19, 2022.
European Patent Application No. EP18900411.2, Partial Supplementary European Search Report dated Sep. 9, 2021.
Final Office Action dated Jan. 6, 2022 on for U.S. Appl. No. 16/529,360, filed Aug. 1, 2019, 40 pages.
Final Office Action dated Aug. 9, 2021 on for U.S. Appl. No. 16/529,402, filed Aug. 1, 2019, 43 pages.
Final Office Action dated Aug. 9, 2021 on for U.S. Appl. No. 16/573,577, filed Sep. 17, 2019, 16 pages.
Final Office Action dated Jul. 9, 2021 on for U.S. Appl. No. 16/525,142, filed Jul. 29, 2019, 18 pages.
Ghamkhari et al., "Energy and Performance Management of Green Data Centers: A Profit Maximization Approach," IEEE Transactions on Smart Grid, Jun. 2013, vol. 4 (2), pp. 1017-1025.
Ghatikar et al., "Demand Response Opportunities and Enabling Technologies for DataCenters: Findings from Field Studies," Lawrence Berkeley National Laboratory, Aug. 2012, 57 pages.
Huang et al., "Data Center Energy Cost Optimization in Smart Grid: a Review," Journal of Zhejiang University (Engineering Science), 2016, vol. 50 (12), pp. 2386-2399.
International Search Report and Written Opinion of PCT Application No. PCT/US2021/045972, dated Nov. 15, 2021, 16 pages.
Kiani et al., "Profit Maximization for Geographical Dispersed Green Data Centers," Arxiv.org, Cornell University Library, 201 Olin Library Cornell University Ithaca, Apr. 2015, pp. 1-5.
Li et al., "iSwitch: Coordinating and Optimizing Renewable Energy Powered Server Clusters," 2012 39th Annual International Symposium on Computer Architecture, Jun. 2012, pp. 512-523.
Non-Final Office Action dated Dec. 24, 2021 on for U.S. Appl. No. 17/128,830, filed Dec. 21, 2020, 4 pages.
Notice of Allowance dated Jul. 26, 2021 on for U.S. Appl. No. 16/284,610, filed Feb. 25, 2019, 2 pages.
Notice of Allowance dated Oct. 8, 2021 on for U.S. Appl. No. 16/528,348, filed Jul. 31, 2019, 3 pages.
Notice of Allowance dated Feb. 2, 2022, for U.S. Appl. No. 16/525,142, filed Jul. 29, 2019, 5 pages.
Notice of Allowance dated Feb. 3, 2022, for U.S. Appl. No. 16/573,577, filed Sep. 17, 2019, 8 pages.
Notice of Allowance dated Jan. 5, 2022, for U.S. Appl. No. 16/658,983, filed Oct. 21, 2019, 14 pages.
Notice of Allowance dated Apr. 18, 2022, for U.S. Appl. No. 17/128,830, filed Dec. 21, 2020, 7 pages.
Notice of Allowance dated Jan. 24, 2022, for U.S. Appl. No. 16/525,142, filed Jul. 29, 2019, 9 pages.
Notice of Allowance dated Sep. 24, 2021 for U.S. Appl. No. 16/528,348, filed Jul. 31, 2019, 06 pages.
Notice of Allowance dated Jan. 26, 2022, for U.S. Appl. No. 17/328,275, filed May 24, 2021, 10 pages.
Wang et al., "SHIP: Scalable Hierarchical Power Control for Large-scale Data Centers," 2009 18th International Conference onParallel Architectures and Compilation Techniques, Sep. 2009, pp. 91-100.
ERCOT, Business Procedures, Load Resource Qualification, Initial Qualification and Periodic Testing, Controllable Load Qualification Test Procedure for Ancillary Services (Jun. 1, 2014).
ERCOT, Business Procedures, Load Resource Qualification, Non-Controllable Load Resource Qualification and Testing Procedure, V1.1 (Apr. 1, 2011).
ERCOT, Controllable Load Resource (CLR) Participation in the ERCOT Market (Dec. 20, 2007).
ERCOT, Emergency Response Service Technical Requirements & Scope of Work, Oct. 1, 2018 through Jan. 31, 2019.
ERCOT, ERS QSE Training 101, Updated Apr. 6, 2022.
ERCOT, Large Flexible Load Resource Participation in the ERCOT Region, presentation to Large Flexible Load Task Force (Apr. 26, 2022).
ERCOT, Load Resource Participation in the ERCOT Region, presentation (Sep. 27, 2022).
ERCOT, Nodal Protocols (Oct. 18, 2019)—Applicant particularly notes the following pp. 2-4, 2-5, 2-15, 2-17, 2-24 to 26, 2-28, 2-29, 2-38, 2-41, 2-51, 2-52, 2-58, 2-62 to 63, 2-67, 2-69, 3-77 to 80, 3-176 to 3-186, 3-208 to 213, 3-214 to 216, 4-1 to 4, 4-10, 4-20, 4-25 to 27, 4-59 to 62, 4-64 to 67, 6-100 to 116, 8-1 to 58.
European Patent Application No. 19878191.6, Extended European Search Report dated Jul. 4, 2022.
European Patent Application No. 19858739.6, Extended European Search Report dated May 31, 2022.
European Patent Application No. 19877576.9, Extended European Search Report dated Jun. 3, 2022.
European Patent Application No. 20738289.6, Extended European Search Report dated Aug. 8, 2022.
European Patent Application No. 22157111.0, Extended European Search Report dated Aug. 17, 2022.
Non-Final Office Action dated Oct. 6, 2022 on for U.S. Appl. No. 17/331,440, filed May 26, 2021, 4 pages.
Non-Final Office Action dated Sep. 22, 2022 on for U.S. Appl. No. 16/961,386, filed Jul. 10, 2020, 52 pages.
Non-Final Office Action dated Aug. 25, 2022 on for U.S. Appl. No. 16/529,360, filed Aug. 1, 2019, 91 pages.
Non-Final Office Action dated Sep. 29, 2022 on for U.S. Appl. No. 17/353,285, filed Jun. 21, 2021, 16 pages.
Notice of Allowance dated Aug. 10, 2022 on for U.S. Appl. No. 17/328,337, filed May 24, 2021, 9 pages.
Notice of Allowance dated May 31, 2022 on for U.S. Appl. No. 16/529,402, filed Aug. 1, 2019 13 pages.
Notice of Allowance dated Aug. 3, 2022, for U.S. Appl. No. 17/340,886, filed Jun. 7, 2021, 09 pages.
Wierman et al., "Opportunities and Challenges for Data Center Demand Response," International Green Computing Conference,IEEE, Nov. 2014, pp. 1-10.
Examination Report dated Jan. 17, 2023 for EP Application No. EP19858812.1 filed on Mar. 25, 2021.
U.S. Appl. No. 62/556,880, filed Sep. 11, 2017 (claims, spec, and appendix).

* cited by examiner

SYSTEM OF CRITICAL DATACENTERS AND BEHIND-THE-METER FLEXIBLE DATACENTERS

CROSS REFERENCE TO RELATED APPLICATION

This application is a Continuation of copending U.S. patent application Ser. No. 16/132,062, filed Sep. 14, 2018, which is incorporated herein by reference in its entirety.

FIELD OF THE INVENTION

This specification relates to a system for controlling the use of "behind-the-meter" power.

BACKGROUND OF THE INVENTION

The price for power distributed through regional and national electric power grids is composed of Generation, Administration, and Transmission & Distribution ("T&D") costs. T&D costs are a significant portion of the overall price paid by consumers for electricity. T&D costs include capital costs (land, equipment, substations, wire, etc.), electrical transmission losses, and operation and maintenance costs. Electrical power is typically generated at local stations (e.g., coal, natural gas, nuclear, and renewable sources) in the Medium Voltage class of 2.4 kVAC to 69 kVAC before being converted in an AC-AC step up transformer to High Voltage at 115 kVAC or above. T&D costs are accrued at the point the generated power leaves the local station and is converted to High Voltage electricity for transmission onto the grid.

Local station operators are paid a variable market price for the amount of power leaving the local station and entering the grid. However, grid stability requires that a balance exist between the amount of power entering the grid and the amount of power used from the grid. Grid stability and congestion is the responsibility of the grid operator and grid operators take steps, including curtailment, to reduce power supply from local stations when necessary. Frequently, the market price paid for generated power will be decreased in order to disincentivize local stations from generating power. In some cases, the market price will go negative, resulting in a cost to local station operators who continue to supply power onto a grid. Grid operators may sometimes explicitly direct a local station operator to reduce or stop the amount of power the local station is supplying to the grid.

Power market fluctuations, power system conditions such as power factor fluctuation or local station startup and testing, and operational directives resulting in reduced or discontinued generation all can have disparate effects on renewal energy generators and can occur multiple times in a day and last for indeterminate periods of time. Curtailment, in particular, is particularly problematic.

According to the National Renewable Energy Laboratory's Technical Report TP-6A20-60983 (March 2014):

[C]urtailment [is] a reduction in the output of a generator from what it could otherwise produce given available resources (e.g., wind or sunlight), typically on an involuntary basis. Curtailments can result when operators or utilities command wind and solar generators to reduce output to minimize transmission congestion or otherwise manage the system or achieve the optimal mix of resources. Curtailment of wind and solar resources typically occurs because of transmission congestion or lack of transmission access, but it can also occur for reasons such as excess generation during low load periods that could cause baseload generators to reach minimum generation thresholds, because of voltage or interconnection issues, or to maintain frequency requirements, particularly for small, isolated grids. Curtailment is one among many tools to maintain system energy balance, which can also include grid capacity, hydropower and thermal generation, demand response, storage, and institutional changes. Deciding which method to use is primarily a matter of economics and operational practice.

"Curtailment" today does not necessarily mean what it did in the early 2000s. Two sea changes in the electric sector have shaped curtailment practices since that time: the utility-scale deployment of wind power, which has no fuel cost, and the evolution of wholesale power markets. These simultaneous changes have led to new operational challenges but have also expanded the array of market-based tools for addressing them.

Practices vary significantly by region and market design. In places with centrally-organized wholesale power markets and experience with wind power, manual wind energy curtailment processes are increasingly being replaced by transparent offer-based market mechanisms that base dispatch on economics. Market protocols that dispatch generation based on economics can also result in renewable energy plants generating less than what they could potentially produce with available wind or sunlight. This is often referred to by grid operators by other terms, such as "downward dispatch." In places served primarily by vertically integrated utilities, power purchase agreements (PPAs) between the utility and the wind developer increasingly contain financial provisions for curtailment contingencies.

Some reductions in output are determined by how a wind operator values dispatch versus non-dispatch. Other curtailments of wind are determined by the grid operator in response to potential reliability events. Still other curtailments result from overdevelopment of wind power in transmission-constrained areas.

Dispatch below maximum output (curtailment) can be more of an issue for wind and solar generators than it is for fossil generation units because of differences in their cost structures. The economics of wind and solar generation depend on the ability to generate electricity whenever there is sufficient sunlight or wind to power their facilities.

Because wind and solar generators have substantial capital costs but no fuel costs (i.e., minimal variable costs), maximizing output improves their ability to recover capital costs. In contrast, fossil generators have higher variable costs, such as fuel costs. Avoiding these costs can, depending on the economics of a specific generator, to some degree reduce the financial impact of curtailment, especially if the generator's capital costs are included in a utility's rate base.

Curtailment may result in available energy being wasted (which may not be true to the same extent for fossil generation units which can simply reduce the amount of fuel that is being used). With wind generation, in particular, it may also take some time for a wind farm to become fully operational following curtailment. As such, until the time that the wind farm is fully operational, the wind farm may not be operating with optimum efficiency and/or may not be able to provide power to the grid.

BRIEF SUMMARY OF THE INVENTION

In an example, a system is described. The system includes a flexible datacenter. The flexible datacenter includes a behind-the-meter power input system, a first power distribution system, a datacenter control system, and a first plurality of computing systems powered by the behind-the-meter power input system via the first power distribution system. The flexible datacenter control system is configured to modulate power delivery to the plurality of computing systems based on one or more monitored power system conditions or an operational directive. The system also includes a critical datacenter. The critical datacenter includes a grid-power input system, a second power distribution system, a critical datacenter control system, and a second plurality of computing systems powered by the grid-power input system via the second power distribution system. The system also includes a first communication link between the flexible datacenter and the critical datacenter, and a routing control system. The routing control system is configured to: (i) identify a computational operation to be performed, (ii) determine whether to route the computational operation to the flexible datacenter, and (iii) based on a determination to route the computational operation to the flexible datacenter, cause the computational operation to be sent to the flexible datacenter via the first communication link.

In another example, a system is described. The system includes a plurality of flexible datacenters. Each flexible datacenter includes a behind-the-meter power input system, a first power distribution system, a datacenter control system, and a first plurality of computing systems powered by the behind-the-meter power input system. The flexible datacenter control system is configured to modulate power delivery to the plurality of computing systems based on one or more monitored power system conditions or an operational directive. The system also includes a critical datacenter comprising: a grid-power input system, a second power distribution system, a critical datacenter control system, and a second plurality of computing systems powered by the grid-power input system via the second power distribution system. The system also includes a first communication link between the plurality of flexible datacenter and the critical datacenter, and a routing control system. The routing control system is configured to (i) receive a computational operation, (ii) determine whether to route the computational operation to a flexible datacenter in the plurality of flexible datacenters, (iii) based on a determination to route the computational operation to a flexible datacenter in the plurality of flexible datacenters, determine a specific flexible datacenter in the plurality of flexible datacenters to route the computational operation to, and (iv) cause the computational operation to be sent to the specific flexible datacenter via the first communication link.

Other aspects of the present invention will be apparent from the following description and claims.

DETAILED DESCRIPTION OF THE INVENTION

Figure 1:
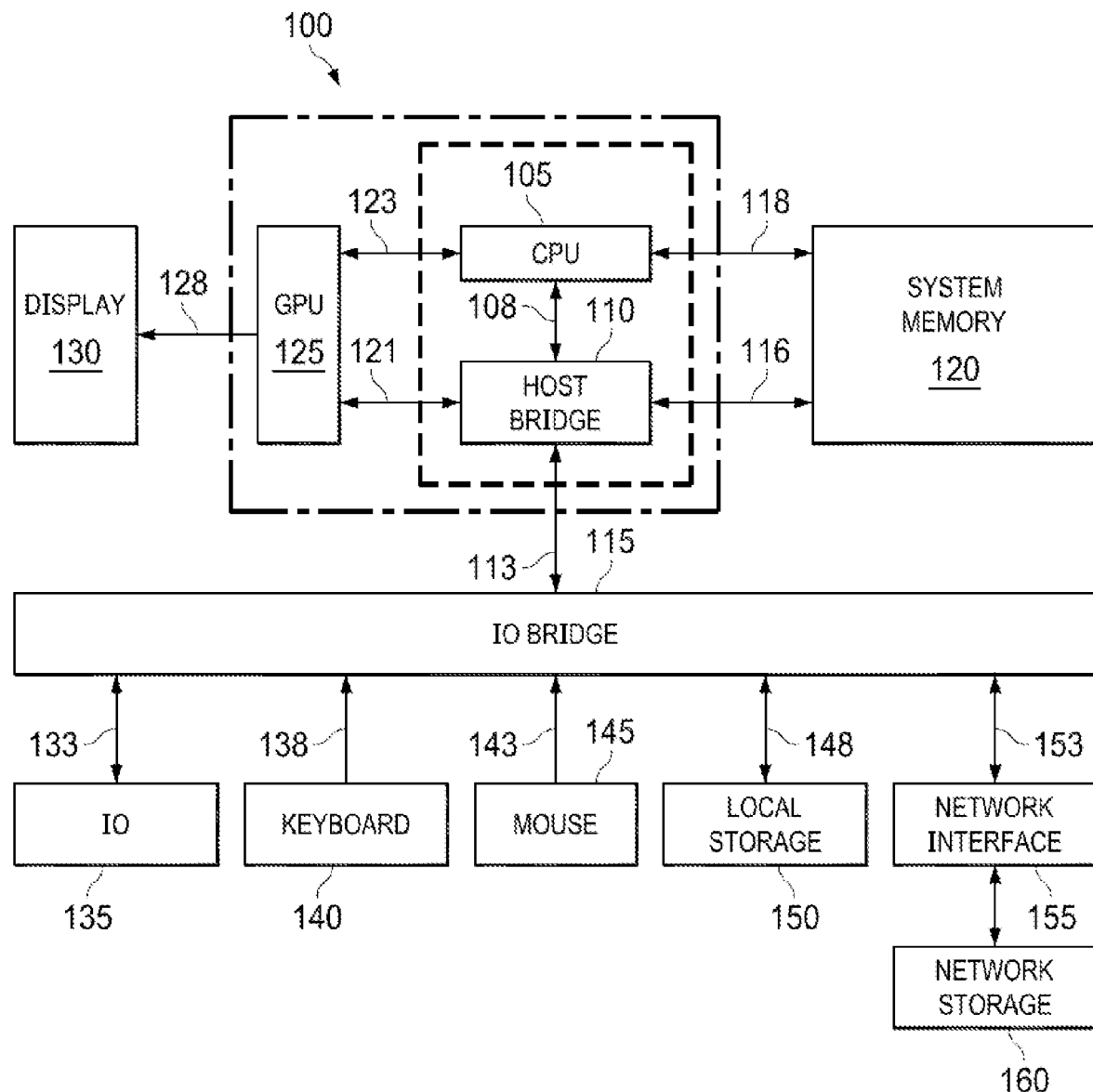
FIG. 1 shows a computing system in accordance with one or more embodiments of the present invention.

One or more embodiments of the present invention are described in detail with reference to the accompanying figures. For consistency, like elements in the various figures are denoted by like reference numerals. In the following detailed description of the present invention, specific details are set forth in order to provide a thorough understanding of the present invention. In other instances, well-known features to one having ordinary skill in the art are not described to avoid obscuring the description of the present invention.

The embodiments provided herein relate to providing an electrical load "behind the meter" at local stations such that generated power can be directed to the behind-the-meter load instead of onto the grid, typically for intermittent periods of time. "Behind-the-meter" power includes power that is received from a power generation system (for instance, but not limited to, a wind or solar power generation system) prior to the power undergoing step-up transformation to High Voltage class AC power for transmission to the grid. Behind-the-meter power may therefore include power drawn directly from an intermittent grid-scale power generation system (e.g. a wind farm or a solar array) and not from the grid.

The embodiments herein provide an advantage when, for example, the power system conditions exhibit excess local power generation at a local station level, excess local power generation that a grid cannot receive, local power generation that is subject to economic curtailment, local power generation that is subject to reliability curtailment, local power generation that is subject to power factor correction, low local power generation, start up local power generation situations, transient local power generation situations, conditions where the cost for power is economically viable (e.g., low cost for power), or testing local power generation situations where there is an economic advantage to using local behind-the-meter power generation. This is not least because the excess power can be utilized by the behind-the-meter electrical load rather than going to waste. In addition, by providing an electrical load behind-the-meter rather than connected to the grid, electrical transmission losses resulting from transmission of power through the grid can be reduced. In addition, any degradation in the power generation systems which may result from curtailment may be reduced.

Preferably, controlled computing systems that consume electrical power through computational operations can provide a behind-the-meter electrical load that can be granularly ramped up and down quickly under the supervision of control systems that monitor power system conditions and direct the power state and/or computational activity of the computing systems. In one embodiment, the computing systems preferably receive all their power for computational operations from a behind-the-meter power source. In another embodiment, the computing systems may additionally include a connection to grid power for supervisory and communication systems or other ancillary needs. In yet another embodiment, the computing systems can be configured to switch between behind-the-meter power and grid power under the direction of a control system.

Among other benefits, a computing system load with controlled granular ramping allows a local station to avoid negative power market pricing and to respond quickly to grid directives.

Various computing systems can provide granular behind-the-meter ramping. Preferably the computing systems perform computational tasks that are immune to, or not substantially hindered by, frequent interruptions or slow-downs in processing as the computing systems ramp up and down. In one embodiment, control systems can activate or deactivate one or more computing systems in an array of similar or identical computing systems sited behind the meter. For example, one or more blockchain miners, or groups of blockchain miners, in an array may be turned on or off. In another embodiment, control systems can direct time-insensitive computational tasks to computational hardware, such as CPUs and GPUs, sited behind the meter, while other hardware is sited in front of the meter and possibly remote from the behind-the-meter hardware. Any parallel computing processes, such as Monte Carlo simulations, batch processing of financial transactions, graphics rendering, and oil and gas field simulation models are all good candidates for such interruptible computational operations.

A typical datacenter provides computational resources to support computational operations. Particularly, one or more enterprises may assign computational operations to the typical datacenter with expectations that the typical datacenter reliably provides resources to support the computational operations, such as processing abilities, networking, and/or storage. The computational operations assigned to a typical datacenter may vary in their requirements. Some computational operations may require low-latency processing, or are extremely time sensitive, or require a high degree of support and reliability from the datacenter. Other computational operations are not time sensitive and can be batch processed over time, or can be distributed across multiple computational systems with interruptible parallel processing, or can be run on specialized hardware for more efficient processing. Therefore, there can be an economic advantage to sending computational operations to different types of datacenters that have different costs for different types of computational operations. According to embodiments disclosed here, a system of one or more high-compute-cost critical datacenters and one or more low-compute-cost flexible datacenters provides such an economic advantage.

A critical datacenter may have a similar configuration to a typical datacenter. Due to the need to reliably provide computing resources to support critical operations, a critical datacenter is preferably connected to a reliable power source, such as the power grid with multiple redundant power supply systems. The power grid will offer a constant power supply that the critical datacenter uses to meet the needs of assigned computational operations. However, the grid power that enables the critical datacenter to provide the required computational resources is a very significant expense.

In addition, it might also be difficult to estimate future costs associated with utilizing the critical datacenter for critical computational operations. The cost for power from the power grid can fluctuate in price depending on various factors, including the location of the critical datacenter using the power, the overall demand for the power, weather conditions, fuel costs endured by suppliers of the power to the power grid, and time of use, among others.

Example embodiments presented herein aim to reduce the cost associated with using a critical database to perform computational operations. In particular, some examples involve using one or more flexible datacenters to offload computational operations from a critical datacenter. As described below with regards to FIG. 2, a flexible datacenter may use behind-the-meter power in order to provide processing abilities and other computing resources. By using behind-the-meter power from renewable energy sources (e.g., wind farm 600, solar farm 700) and other behind-the-meter power sources, a flexible datacenter can provide computing resources at very low costs, significantly below the costs incurred to power a critical datacenter. As such, one or more flexible datacenters may assist a critical datacenter in efficiently handling computational operations assigned to the critical datacenter by one or more enterprises.

In some examples, a critical datacenter may offload some or all of a set of computational operations to one or more flexible datacenters. Particularly, when conditions signal that use of a flexible datacenter is economically viable (i.e., at the same or decreased costs relative to using power from the power grid at the critical datacenter), a flexible datacenter may assume some or even all of one or more sets of computational operations from the critical datacenter. In some instances, the critical datacenter may offload less critical computational operations to a flexible datacenter to support and manage. In such a configuration, the critical datacenter may continue to support critical operations assigned to the critical datacenter by one or more enterprises while offloading less critical operations to one or more flexible datacenters. As a result, the critical datacenter may ensure that the critical operations remain supported by computational resources powered by grid power.

In other examples, a flexible datacenter may assume critical operations, augmenting the resources provided by the critical datacenter. Particularly, situations can arise where the flexible datacenter can operate at a lower cost than the critical datacenter. For instance, one or more behind-the-meter power sources (e.g., wind farm 600, solar farm 700) may enable the flexible datacenter to operate at a lower cost than the critical datacenter. As a result, using the flexible datacenter instead of the critical datacenter can lower the costs required to support assigned computing operations. If the situation changes such that the flexible datacenter is no longer less costly than the critical datacenter, the critical datacenter can reassume the computing operations from the flexible datacenter.

As shown herein, by having one or more flexible datacenters powered by one or more behind-the-meter power sources available, computing operations can be managed in a dynamic manner between the critical datacenter and the flexible datacenters. The dynamic management can lower costs and, in some cases, decrease the time needed to complete time-sensitive computing operations submitted to the critical datacenter by an enterprise.

FIG. 1 shows a computing system 100 in accordance with one or more embodiments of the present invention. Computing system 100 may include one or more central processing units (singular "CPU" or plural "CPUs") 105, host bridge 110, input/output ("IO") bridge 115, graphics processing units (singular "GPU" or plural "GPUs") 125, and/or application-specific integrated circuits (singular "ASIC or plural "ASICs") (not shown) disposed on one or more printed circuit boards (not shown) that are configured to perform computational operations. Each of the one or more CPUs 105, GPUs 125, or ASICs (not shown) may be a single-core (not independently illustrated) device or a multi-core (not independently illustrated) device. Multi-core devices typically include a plurality of cores (not shown) disposed on the same physical die (not shown) or a plurality of cores (not shown) disposed on multiple die (not shown) that are collectively disposed within the same mechanical package (not shown).

CPU 105 may be a general purpose computational device typically configured to execute software instructions. CPU 105 may include an interface 108 to host bridge 110, an interface 118 to system memory 120, and an interface 123 to one or more IO devices, such as, for example, one or more GPUs 125. GPU 125 may serve as a specialized computational device typically configured to perform graphics functions related to frame buffer manipulation. However, one of ordinary skill in the art will recognize that GPU 125 may be used to perform non-graphics related functions that are computationally intensive. In certain embodiments, GPU 125 may interface 123 directly with CPU 125 (and interface 118 with system memory 120 through CPU 105). In other embodiments, GPU 125 may interface 121 with host bridge 110 (and interface 116 or 118 with system memory 120 through host bridge 110 or CPU 105 depending on the application or design). In still other embodiments, GPU 125 may interface 133 with IO bridge 115 (and interface 116 or 118 with system memory 120 through host bridge 110 or CPU 105 depending on the application or design). The functionality of GPU 125 may be integrated, in whole or in part, with CPU 105.

Host bridge 110 may be an interface device configured to interface between the one or more computational devices and JO bridge 115 and, in some embodiments, system memory 120. Host bridge 110 may include an interface 108 to CPU 105, an interface 113 to JO bridge 115, for embodiments where CPU 105 does not include an interface 118 to system memory 120, an interface 116 to system memory 120, and for embodiments where CPU 105 does not include an integrated GPU 125 or an interface 123 to GPU 125, an interface 121 to GPU 125. The functionality of host bridge 110 may be integrated, in whole or in part, with CPU 105. JO bridge 115 may be an interface device configured to interface between the one or more computational devices and various JO devices (e.g., 140, 145) and JO expansion, or add-on, devices (not independently illustrated). JO bridge 115 may include an interface 113 to host bridge 110, one or more interfaces 133 to one or more JO expansion devices 135, an interface 138 to keyboard 140, an interface 143 to mouse 145, an interface 148 to one or more local storage devices 150, and an interface 153 to one or more network interface devices 155. The functionality of JO bridge 115 may be integrated, in whole or in part, with CPU 105 or host bridge 110. Each local storage device 150, if any, may be a solid-state memory device, a solid-state memory device array, a hard disk drive, a hard disk drive array, or any other non-transitory computer readable medium. Network interface device 155 may provide one or more network interfaces including any network protocol suitable to facilitate networked communications.

Computing system 100 may include one or more network-attached storage devices 160 in addition to, or instead of, one or more local storage devices 150. Each network-attached storage device 160, if any, may be a solid-state memory device, a solid-state memory device array, a hard disk drive, a hard disk drive array, or any other non-transitory computer readable medium. Network-attached storage device 160 may or may not be collocated with computing system 100 and may be accessible to computing system 100 via one or more network interfaces provided by one or more network interface devices 155.

One of ordinary skill in the art will recognize that computing system 100 may be a conventional computing system or an application-specific computing system. In certain embodiments, an application-specific computing system may include one or more ASICs (not shown) that are configured to perform one or more functions, such as hashing, in a more efficient manner. The one or more ASICs (not shown) may interface directly with CPU 105, host bridge 110, or GPU 125 or interface through JO bridge 115. Alternatively, in other embodiments, an application-specific computing system may be reduced to only those components necessary to perform a desired function in an effort to reduce one or more of chip count, printed circuit board footprint, thermal design power, and power consumption. The one or more ASICs (not shown) may be used instead of one or more of CPU 105, host bridge 110, IO bridge 115, or GPU 125. In such systems, the one or more ASICs may incorporate sufficient functionality to perform certain network and computational functions in a minimal footprint with substantially fewer component devices.

As such, one of ordinary skill in the art will recognize that CPU 105, host bridge 110, IO bridge 115, GPU 125, or ASIC (not shown) or a subset, superset, or combination of functions or features thereof, may be integrated, distributed, or excluded, in whole or in part, based on an application, design, or form factor in accordance with one or more embodiments of the present invention. Thus, the description of computing system 100 is merely exemplary and not intended to limit the type, kind, or configuration of component devices that constitute a computing system 100 suitable for performing computing operations in accordance with one or more embodiments of the present invention.

One of ordinary skill in the art will recognize that computing system 100 may be a stand-alone, laptop, desktop, server, blade, or rack mountable system and may vary based on an application or design.

Figure 2:
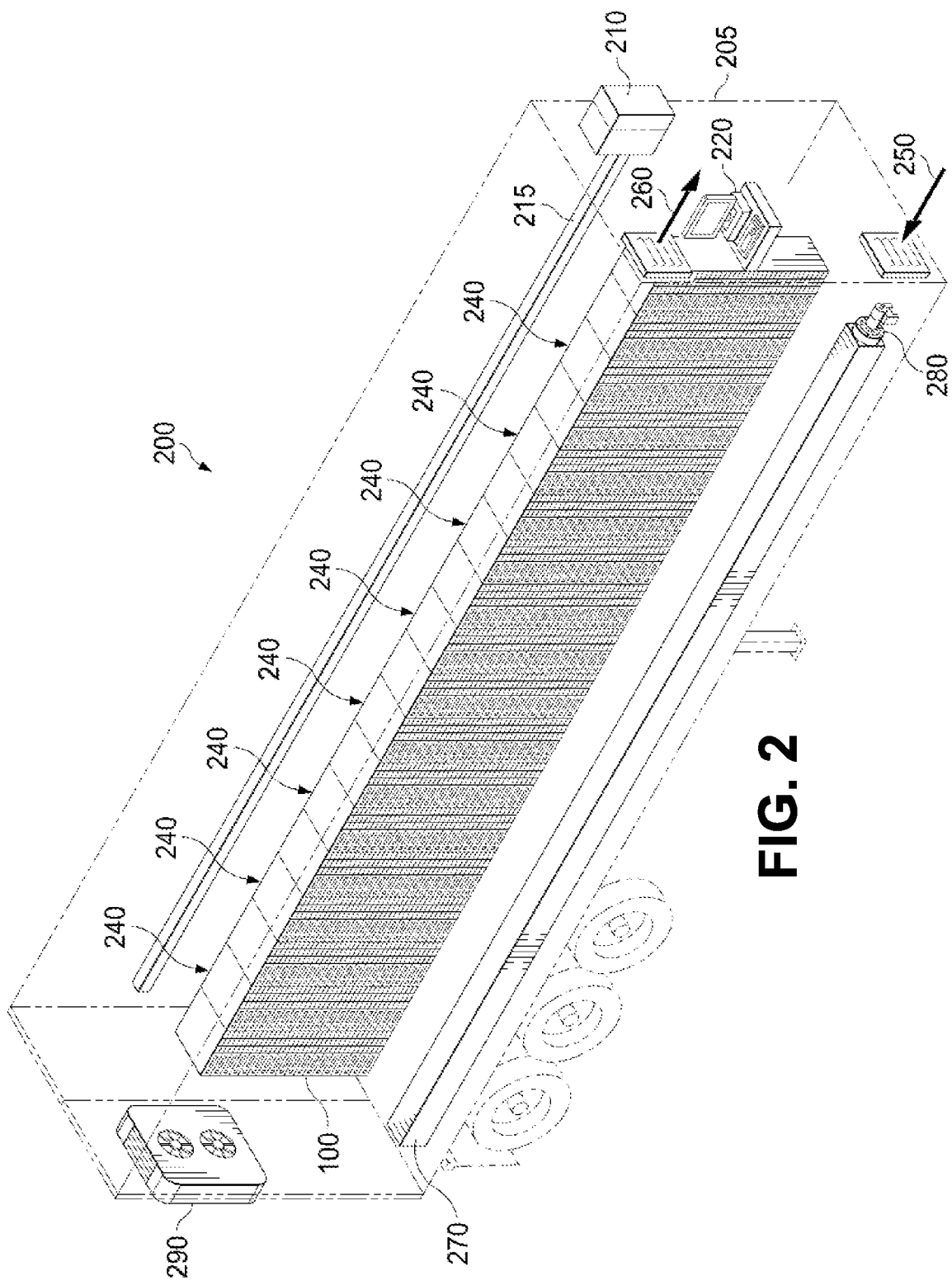
FIG. 2 shows a flexible datacenter in accordance with one or more embodiments of the present invention.

FIG. 2 shows a flexible datacenter 200 in accordance with one or more embodiments of the present invention. Flexible datacenter 200 may include a mobile container 205, a behind-the-meter power input system 210, a power distribution system 215, a climate control system (e.g., 250, 260, 270, 280, and/or 290), a datacenter control system 220, and a plurality of computing systems 100 disposed in one or more racks 240. Datacenter control system 220 may be a computing system (e.g., 100 of FIG. 1) configured to dynamically modulate power delivery to one or more computing systems 100 disposed within flexible datacenter 200 based on behind-the-meter power availability or an operational directive from a local station control system (not shown), a remote master control system (not shown), or a grid operator (not shown).

In certain embodiments, mobile container 205 may be a storage trailer disposed on wheels and configured for rapid deployment. In other embodiments, mobile container 205 may be a storage container (not shown) configured for placement on the ground and potentially stacked in a vertical or horizontal manner (not shown). In still other embodiments, mobile container 205 may be an inflatable container, a floating container, or any other type or kind of container suitable for housing a mobile datacenter 200. And in still other embodiments, flexible datacenter 200 might not include a mobile container. For example, flexible datacenter 200 may be situated within a building or another type of stationary environment.

Flexible datacenter 200 may be rapidly deployed on site near a source of unutilized behind-the-meter power generation. Behind-the-meter power input system 210 may be configured to input power to flexible datacenter 200. Behind-the-meter power input system 210 may include a first input (not independently illustrated) configured to receive three-phase behind-the-meter alternating current ("AC") voltage. In certain embodiments, behind-the-meter power input system 210 may include a supervisory AC-to-AC step-down transformer (not shown) configured to step down three-phase behind-the-meter AC voltage to single-phase supervisory nominal AC voltage or a second input (not independently illustrated) configured to receive single-phase supervisory nominal AC voltage from the local station (not shown) or a metered source (not shown). Behind-the-meter power input system 210 may provide single-phase supervisory nominal AC voltage to datacenter control system 220, which may remain powered at almost all times to control the operation of flexible datacenter 200. The first input (not independently illustrated) or a third input (not independently illustrated) of behind-the-meter power input system 210 may direct three-phase behind-the-meter AC voltage to an operational AC-to-AC step-down transformer (not shown) configured to controllably step down three-phase behind-the-meter AC voltage to three-phase nominal AC voltage. Datacenter control system 220 may controllably enable or disable generation or provision of three-phase nominal AC voltage by the operational AC-to-AC step-down transformer (not shown).

Behind-the-meter power input system 210 may provide three phases of three-phase nominal AC voltage to power distribution system 215. Power distribution system 215 may controllably provide a single phase of three-phase nominal AC voltage to each computing system 100 or group 240 of computing systems 100 disposed within flexible datacenter 200. Datacenter control system 220 may controllably select which phase of three-phase nominal AC voltage that power distribution system 215 provides to each computing system 100 or group 240 of computing systems 100. In this way, datacenter control system 220 may modulate power delivery by either ramping-up flexible datacenter 200 to fully operational status, ramping-down flexible datacenter 200 to offline status (where only datacenter control system 220 remains powered), reducing power consumption by withdrawing power delivery from, or reducing power to, one or more computing systems 100 or groups 240 of computing systems 100, or modulating a power factor correction factor for the local station by controllably adjusting which phases of three-phase nominal AC voltage are used by one or more computing systems 100 or groups 240 of computing systems 100. In some embodiments, flexible datacenter 200 may receive DC power to power computing systems 100.

Flexible datacenter 200 may include a climate control system (e.g., 250, 260, 270, 280, 290) configured to maintain the plurality of computing systems 100 within their operational temperature range. In certain embodiments, the climate control system may include an air intake 250, an evaporative cooling system 270, a fan 280, and an air outtake 260. In other embodiments, the climate control system may include an air intake 250, an air conditioner or refrigerant cooling system 290, and an air outtake 260. In still other embodiments, the climate control system may include a computer room air conditioner system (not shown), a computer room air handler system (not shown), or an immersive cooling system (not shown). One of ordinary skill in the art will recognize that any suitable heat extraction system (not shown) configured to maintain the operation of the plurality of computing systems 100 within their operational temperature range may be used in accordance with one or more embodiments of the present invention.

Flexible datacenter 200 may include a battery system (not shown) configured to convert three-phase nominal AC voltage to nominal DC voltage and store power in a plurality of storage cells. The battery system (not shown) may include a DC-to-AC inverter configured to convert nominal DC voltage to three-phase nominal AC voltage for flexible datacenter 200 use. Alternatively, the battery system (not shown) may include a DC-to-AC inverter configured to convert nominal DC voltage to single-phase nominal AC voltage to power datacenter control system 220.

One of ordinary skill in the art will recognize that a voltage level of three-phase behind-the-meter AC voltage may vary based on an application or design and the type or kind of local power generation. As such, a type, kind, or configuration of the operational AC-to-AC step down transformer (not shown) may vary based on the application or design. In addition, the frequency and voltage level of three-phase nominal AC voltage, single-phase nominal AC voltage, and nominal DC voltage may vary based on the application or design in accordance with one or more embodiments of the present invention.

Figure 3:
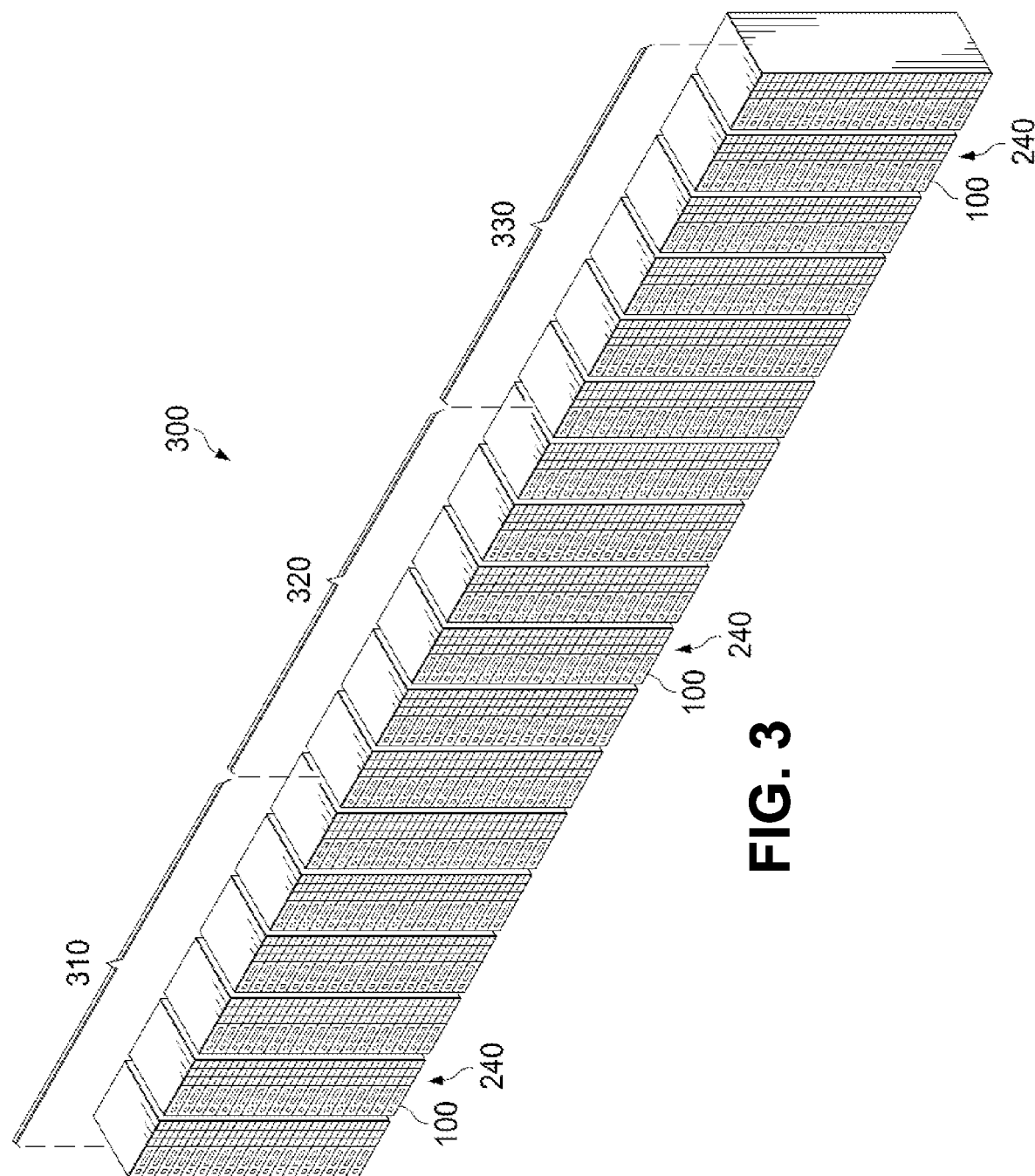
FIG. 3 shows a three-phase power distribution of a flexible datacenter in accordance with one or more embodiments of the present invention.

FIG. 3 shows a three-phase power distribution of a flexible datacenter 200 in accordance with one or more embodiments of the present invention. Flexible datacenter 200 may include a plurality of racks 240, each of which may include one or more computing systems 100 disposed therein. As discussed above, the behind-the-meter power input system (210 of FIG. 2) may provide three phases of three-phase nominal AC voltage to the power distribution system (215 of FIG. 2). The power distribution system (215 of FIG. 2) may controllably provide a single phase of three-phase nominal AC voltage to each computing system 100 or group 240 of computing systems 100 disposed within flexible datacenter 200. For example, a flexible datacenter 200 may include eighteen racks 240, each of which may include eighteen computing systems 100. The power distribution system (215 of FIG. 2) may control which phase of three-phase nominal AC voltage is provided to one or more computing systems 100, a rack 240 of computing systems 100, or a group (e.g., 310, 320, or 330) of racks 240 of computing systems 100.

In the figure, for purposes of illustration only, eighteen racks 240 are divided into a first group of six racks 310, a second group of six racks 320, and a third group of six racks 330, where each rack contains eighteen computing systems 100. The power distribution system (215 of FIG. 2) may, for example, provide a first phase of three-phase nominal AC voltage to the first group of six racks 310, a second phase of three-phase nominal AC voltage to the second group of six racks 320, and a third phase of three-phase nominal AC voltage to the third group of six racks 330. If the flexible datacenter (200 of FIG. 2) receives an operational directive from the local station (not shown) to provide power factor correction, the datacenter control system (220 of FIG. 2) may direct the power distribution system (215 of FIG. 2) to adjust which phase or phases of three-phase nominal AC voltage are used to provide the power factor correction required by the local station (not shown) or grid operator (not shown). One of ordinary skill in the art will recognize that, in addition to the power distribution, the load may be varied by adjusting the number of computing systems 100 operatively powered. As such, the flexible datacenter (200 of FIG. 2) may be configured to act as a capacitive or inductive load to provide the appropriate reactance necessary to achieve the power factor correction required by the local station (not shown).

Figure 4:
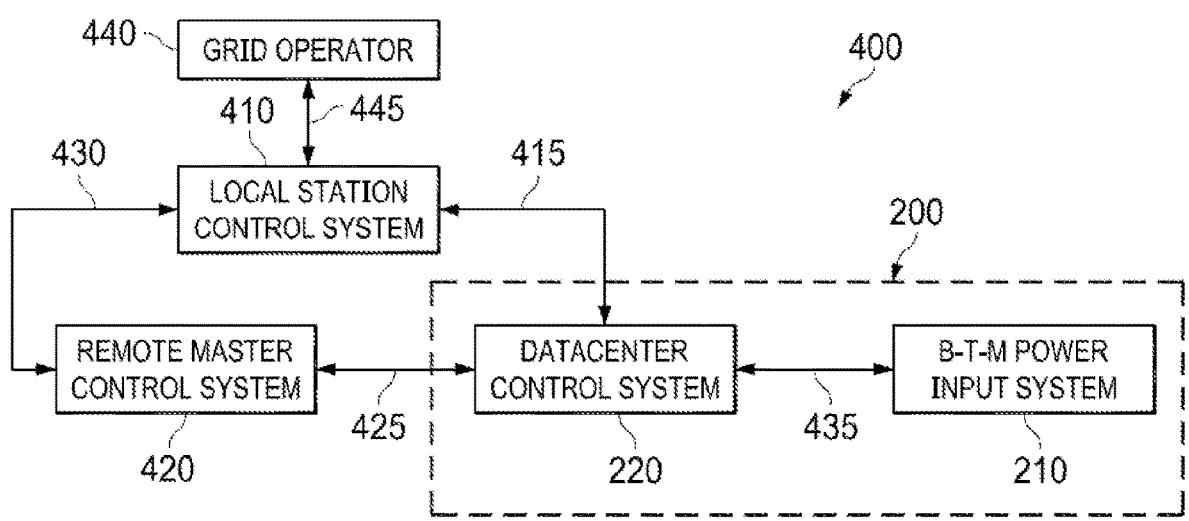
FIG. 4 shows a control distribution scheme of a flexible datacenter in accordance with one or more embodiments of the present invention.

FIG. 4 shows a control distribution scheme 400 of a flexible datacenter 200 in accordance with one or more embodiments of the present invention. Datacenter control system 220 may independently, or cooperatively with one or more of local station control system 410, remote master control system 420, and grid operator 440, modulate power delivery to flexible datacenter 200. Specifically, power delivery may be dynamically adjusted based on conditions or operational directives.

Local station control system 410 may be a computing system (e.g., 100 of FIG. 1) that is configured to control various aspects of the local station (not independently illustrated) that generates power and sometimes generates unutilized behind-the-meter power. Local station control system 410 may communicate with remote master control system 420 over a networked connection 430 and with datacenter control system 220 over a networked or hardwired connection 415. Remote master control system 420 may be a computing system (e.g., 100 of FIG. 1) that is located offsite, but connected via a network connection 425 to datacenter control system 220, that is configured to provide supervisory or override control of flexible datacenter 200 or a fleet (not shown) of flexible datacenters 200. Grid operator 440 may be a computing system (e.g., 100 of FIG. 1) that is configured to control various aspects of the grid (not independently illustrated) that receives power from the local station (not independently illustrated). Grid operator 440 may communicate with local station control system 440 over a networked or hardwired connection 445.

Datacenter control system 220 may monitor unutilized behind-the-meter power availability at the local station (not independently illustrated) and determine when a datacenter ramp-up condition is met. Unutilized behind-the-meter power availability may include one or more of excess local power generation, excess local power generation that the grid cannot accept, local power generation that is subject to economic curtailment, local power generation that is subject to reliability curtailment, local power generation that is subject to power factor correction, conditions where the cost for power is economically viable (e.g., low cost for power), situations where local power generation is prohibitively low, start up situations, transient situations, or testing situations where there is an economic advantage to using locally generated behind-the-meter power generation, specifically power available at little to no cost and with no associated transmission or distribution losses or costs.

The datacenter ramp-up condition may be met if there is sufficient behind-the-meter power availability and there is no operational directive from local station control system 410, remote master control system 420, or grid operator 440 to go offline or reduce power. As such, datacenter control system 220 may enable 435 behind-the-meter power input system 210 to provide three-phase nominal AC voltage to the power distribution system (215 of FIG. 2) to power the plurality of computing systems (100 of FIG. 2) or a subset thereof. Datacenter control system 220 may optionally direct one or more computing systems (100 of FIG. 2) to perform predetermined computational operations. For example, if the one or more computing systems (100 of FIG. 2) are configured to perform blockchain hashing operations, datacenter control system 220 may direct them to perform blockchain hashing operations for a specific blockchain application, such as, for example, Bitcoin, Litecoin, or Ethereum. Alternatively, one or more computing systems (100 of FIG. 2) may be configured to independently receive a computational directive from a network connection (not shown) to a peer-to-peer blockchain network (not shown) such as, for example, a network for a specific blockchain application, to perform predetermined computational operations.

Remote master control system 420 may specify to datacenter control system 220 what sufficient behind-the-meter power availability constitutes, or datacenter control system 220 may be programmed with a predetermined preference or criteria on which to make the determination independently. For example, in certain circumstances, sufficient behind-the-meter power availability may be less than that required to fully power the entire flexible datacenter 200. In such circumstances, datacenter control system 220 may provide power to only a subset of computing systems (100 of FIG. 2), or operate the plurality of computing systems (100 of FIG. 2) in a lower power mode, that is within the sufficient, but less than full, range of power that is available.

While flexible datacenter 200 is online and operational, a datacenter ramp-down condition may be met when there is insufficient, or anticipated to be insufficient, behind-the-meter power availability or there is an operational directive from local station control system 410, remote master control system 420, or grid operator 440. Datacenter control system 220 may monitor and determine when there is insufficient, or anticipated to be insufficient, behind-the-meter power availability. As noted above, sufficiency may be specified by remote master control system 420 or datacenter control system 220 may be programmed with a predetermined preference or criteria on which to make the determination independently. An operational directive may be based on current dispatchability, forward looking forecasts for when unutilized behind-the-meter power is, or is expected to be, available, economic considerations, reliability considerations, operational considerations, or the discretion of the local station 410, remote master control 420, or grid operator 440. For example, local station control system 410, remote master control system 420, or grid operator 440 may issue an operational directive to flexible datacenter 200 to go offline and power down. When the datacenter ramp-down condition is met, datacenter control system 220 may disable power delivery to the plurality of computing systems (100 of FIG. 2). Datacenter control system 220 may disable 435 behind-the-meter power input system 210 from providing three-phase nominal AC voltage to the power distribution system (215 of FIG. 2) to power down the plurality of computing systems (100 of FIG. 2), while datacenter control system 220 remains powered and is capable of rebooting flexible datacenter 200 when unutilized behind-the-meter power becomes available again.

While flexible datacenter 200 is online and operational, changed conditions or an operational directive may cause datacenter control system 220 to modulate power consumption by flexible datacenter 200. Datacenter control system 220 may determine, or local station control system 410, remote master control system 420, or grid operator 440 may communicate, that a change in local conditions may result in less power generation, availability, or economic feasibility, than would be necessary to fully power flexible datacenter 200. In such situations, datacenter control system 220 may take steps to reduce or stop power consumption by flexible datacenter 200 (other than that required to maintain operation of datacenter control system 220). Alternatively, local station control system 410, remote master control system 420, or grid operator 440, may issue an operational directive to reduce power consumption for any reason, the cause of which may be unknown. In response, datacenter control system 220 may dynamically reduce or withdraw power delivery to one or more computing systems (100 of FIG. 2) to meet the dictate. Datacenter control system 220 may controllably provide three-phase nominal AC voltage to a smaller subset of computing systems (100 of FIG. 2) to reduce power consumption. Datacenter control system 220 may dynamically reduce the power consumption of one or more computing systems (100 of FIG. 2) by reducing their operating frequency or forcing them into a lower power mode through a network directive.

One of ordinary skill in the art will recognize that datacenter control system 220 may be configured to have a number of different configurations, such as a number or type or kind of computing systems (100 of FIG. 2) that may be powered, and in what operating mode, that correspond to a number of different ranges of sufficient and available unutilized behind-the-meter power availability. As such, datacenter control system 220 may modulate power delivery over a variety of ranges of sufficient and available unutilized behind-the-meter power availability.

Figure 5:
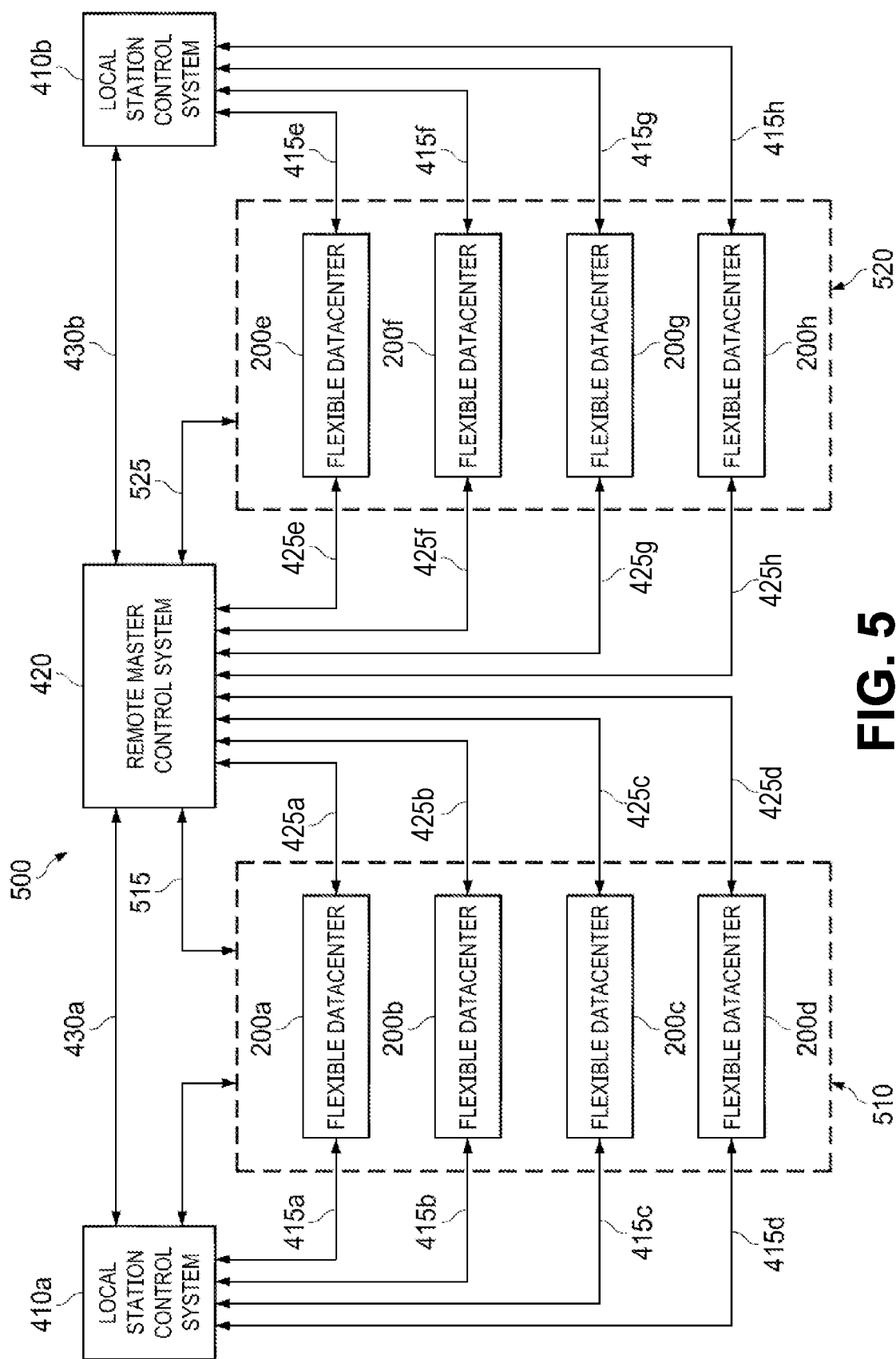
FIG. 5 shows a control distribution scheme of a fleet of flexible datacenters in accordance with one or more embodiments of the present invention.

FIG. 5 shows a control distribution of a fleet 500 of flexible datacenters 200 in accordance with one or more embodiments of the present invention. The control distribution of a flexible datacenter 200 shown and described with respect to FIG. 4 may be extended to a fleet 500 of flexible datacenters 200. For example, a first local station (not independently illustrated), such as, for example, a wind farm (not shown), may include a first plurality 510 of flexible datacenters 200a through 200d, which may be collocated or distributed across the local station (not shown). A second local station (not independently illustrated), such as, for example, another wind farm or a solar farm (not shown), may include a second plurality 520 of flexible datacenters 200e through 200h, which may be collocated or distributed across the local station (not shown). One of ordinary skill in the art will recognize that the number of flexible datacenters 200 deployed at a given station and the number of stations within the fleet may vary based on an application or design in accordance with one or more embodiments of the present invention.

Remote master control system 420 may provide supervisory control over fleet 500 of flexible datacenters 200 in a similar manner to that shown and described with respect to FIG. 4, with the added flexibility to make high level decisions with respect to fleet 500 that may be counterintuitive to a given station. Remote master control system 420 may make decisions regarding the issuance of operational directives to a given local station based on, for example, the status of each local station where flexible datacenters 200 are deployed, the workload distributed across fleet 500, and the expected computational demand required for the expected workload. In addition, remote master control system 420 may shift workloads from a first plurality 510 of flexible datacenters 200 to a second plurality 520 of flexible datacenters 200 for any reason, including, for example, a loss of unutilized behind-the-meter power availability at one local station and the availability of unutilized behind-the-meter power at another local station.

Figure 6:
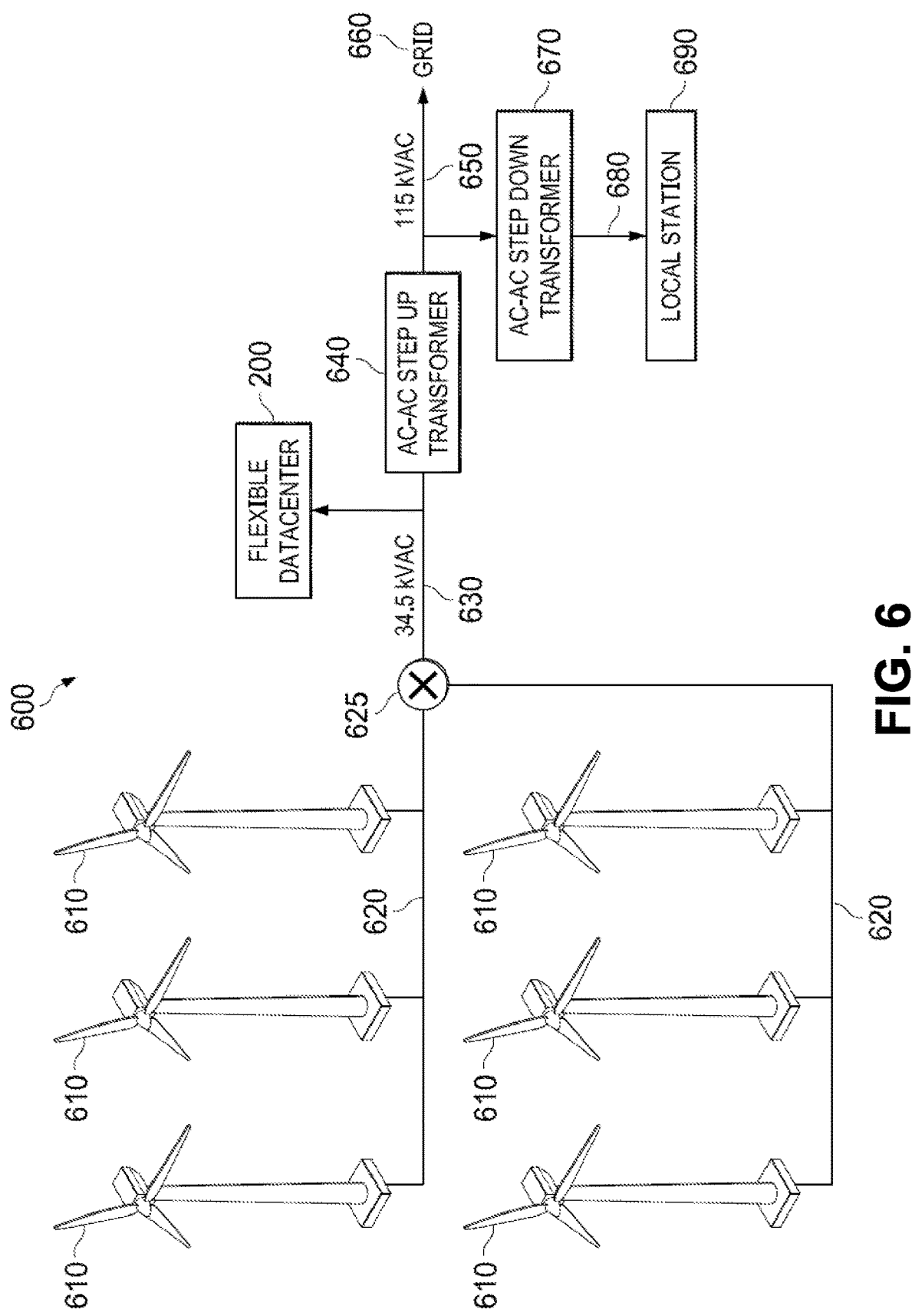
FIG. 6 shows a flexible datacenter powered by one or more wind turbines in accordance with one or more embodiments of the present invention.

FIG. 6 shows a flexible datacenter 200 powered by one or more wind turbines 610 in accordance with one or more embodiments of the present invention. A wind farm 600 typically includes a plurality of wind turbines 610, each of which intermittently generates a wind-generated AC voltage. The wind-generated AC voltage may vary based on a type, kind, or configuration of farm 600, turbine 610, and incident wind speed. The wind-generated AC voltage is typically input into a turbine AC-to-AC step-up transformer (not shown) that is disposed within the nacelle (not independently illustrated) or at the base of the mast (not independently illustrated) of turbine 610. The turbine AC-to-AC step up transformer (not shown) outputs three-phase wind-generated AC voltage 620. Three-phase wind-generated AC voltage 620 produced by the plurality of wind turbines 610 is collected 625 and provided 630 to another AC-to-AC step-up transformer 640 that steps up three-phase wind-generated AC voltage 620 to three-phase grid AC voltage 650 suitable for delivery to grid 660. Three-phase grid AC voltage 650 may be stepped down with an AC-to-AC step-down transformer 670 configured to produce three-phase local station AC voltage 680 provided to local station 690. One of ordinary skill in the art will recognize that the actual voltage levels may vary based on the type, kind, or number of wind turbines 610, the configuration or design of wind farm 600, and grid 660 that it feeds into.

The output side of AC-to-AC step-up transformer 640 that connects to grid 660 may be metered and is typically subject to transmission and distribution costs. In contrast, power consumed on the input side of AC-to-AC step-up transformer 640 may be considered behind-the-meter and is typically not subject to transmission and distribution costs. As such, one or more flexible datacenters 200 may be powered by three-phase wind-generated AC voltage 620. Specifically, in wind farm 600 applications, the three-phase behind-the-meter AC voltage used to power flexible datacenter 200 may be three-phase wind-generated AC voltage 620. As such, flexible datacenter 200 may reside behind-the-meter, avoid transmission and distribution costs, and may be dynamically powered when unutilized behind-the-meter power is available.

Unutilized behind-the-meter power availability may occur when there is excess local power generation. In high wind conditions, wind farm 600 may generate more power than, for example, AC-to-AC step-up transformer 640 is rated for. In such situations, wind farm 600 may have to take steps to protect its equipment from damage, which may include taking one or more turbines 610 offline or shunting their voltage to dummy loads or ground.

Advantageously, one or more flexible datacenters 200 may be used to consume power on the input side of AC-to-AC step-up transformer 640, thereby allowing wind farm 600 to operate equipment within operating ranges while flexible datacenter 200 receives behind-the-meter power without transmission or distribution costs. The local station control system (not independently illustrated) of local station 690 may issue an operational directive to the one or more flexible datacenters 200 or to the remote master control system (420 of FIG. 4) to ramp-up to the desired power consumption level. When the operational directive requires the cooperative action of multiple flexible datacenters 200, the remote mater control system (420 of FIG. 4) may determine how to power each individual flexible datacenter 200 in accordance with the operational directive or provide an override to each flexible datacenter 200.

Another example of unutilized behind-the-meter power availability is when grid 660 cannot, for whatever reason, take the power being produced by wind farm 600. In such situations, wind farm 600 may have to take one or more turbines 610 offline or shunt their voltage to dummy loads or ground. Advantageously, one or more flexible datacenters 200 may be used to consume power on the input side of AC-to-AC step-up transformer 640, thereby allowing wind farm 600 to either produce power to grid 660 at a lower level or shut down transformer 640 entirely while flexible datacenter 200 receives behind-the-meter power without transmission or distribution costs. The local station control system (not independently illustrated) of local station 690 or the grid operator (not independently illustrated) of grid 660 may issue an operational directive to the one or more flexible datacenters 200 or to the remote master control system (420 of FIG. 4) to ramp-up to the desired power consumption level. When the operational directive requires the cooperative action of multiple flexible datacenters 200, the remote master control system (420 of FIG. 4) may determine how to power each individual flexible datacenter 200 in accordance with the operational directive or provide an override to each flexible datacenter 200.

Another example of unutilized behind-the-meter power availability is when wind farm 600 is selling power to grid 660 at a negative price that is offset by a production tax credit. In certain circumstances, the value of the production tax credit may exceed the price wind farm 600 would have to pay to grid 660 to offload their generated power. Advantageously, one or more flexible datacenters 200 may be used to consume power behind-the-meter, thereby allowing wind farm 600 to produce and obtain the production tax credit, but sell less power to grid 660 at the negative price. The local station control system (not independently illustrated) of local station 690 may issue an operational directive to the one or more flexible datacenters 200 or to the remote master control system (420 of FIG. 4) to ramp-up to the desired power consumption level. When the operational directive requires the cooperative action of multiple flexible datacenter 200, the remote master control system (420 of FIG. 4) may determine how to power each individual flexible datacenter 200 in accordance with the operational directive or provide an override to each flexible datacenter 200.

Another example of unutilized behind-the-meter power availability is when wind farm 600 is selling power to grid 660 at a negative price because grid 660 is oversupplied or is instructed to stand down and stop producing altogether. The grid operator (not independently illustrated) may select certain power generation stations to go offline and stop producing power to grid 660. Advantageously, one or more flexible datacenters 200 may be used to consume power behind-the-meter, thereby allowing wind farm 600 to stop producing power to grid 660, but making productive use of the power generated behind-the-meter without transmission or distribution costs. The local station control system (not independently illustrated) of the local station 690 or the grid operator (not independently illustrated) of grid 660 may issue an operational directive to the one or more flexible datacenters 200 or to the remote master control system (420 of FIG. 4) to ramp-up to the desired power consumption level. When the operational directive requires the cooperative action of multiple flexible datacenters 200, the remote master control system (420 of FIG. 4) may determine how to power each individual flexible datacenter 200 in accordance with the operational directive or provide an override to each flexible datacenter 200.

Another example of unutilized behind-the-meter power availability is when wind farm 600 is producing power to grid 660 that is unstable, out of phase, or at the wrong frequency, or grid 660 is already unstable, out of phase, or at the wrong frequency for whatever reason. The grid operator (not independently illustrated) may select certain power generation stations to go offline and stop producing power to grid 660. Advantageously, one or more flexible datacenters 200 may be used to consume power behind-the-meter, thereby allowing wind farm 600 to stop producing power to grid 660, but make productive use of the power generated behind-the-meter without transmission or distribution costs. The local station control system (not independently illustrated) of local station 690 may issue an operational directive to the one or more flexible datacenters 200 or to the remote master control system (420 of FIG. 4) to ramp-up to the desired power consumption level. When the operational directive requires the cooperative action of multiple flexible datacenters 200, the remote master control system (420 of FIG. 4) may determine how to power each individual flexible datacenter 200 in accordance with the operational directive or provide an override to each flexible datacenter 200.

Further examples of unutilized behind-the-meter power availability is when wind farm 600 experiences low wind conditions that make it not economically feasible to power up certain components, such as, for example, the local station (not independently illustrated), but there may be sufficient behind-the-meter power availability to power one or more flexible datacenters 200. Similarly, unutilized behind-the-meter power availability may occur when wind farm 600 is starting up, or testing, one or more turbines 610. Turbines 610 are frequently offline for installation, maintenance, and service and must be tested prior to coming online as part of the array. One or more flexible datacenters 200 may be powered by one or more turbines 610 that are offline from farm 600. The above-noted examples of when unutilized behind-the-meter power is available are merely exemplary and are not intended to limit the scope of what one of ordinary skill in the art would recognize as unutilized behind-the-meter power availability. Unutilized behind-the-meter power availability may occur anytime there is power available and accessible behind-the-meter that is not subject to transmission and distribution costs and there is an economic advantage to using it.

One of ordinary skill in the art will recognize that wind farm 600 and wind turbine 610 may vary based on an application or design in accordance with one or more embodiments of the present invention.

Figure 7:
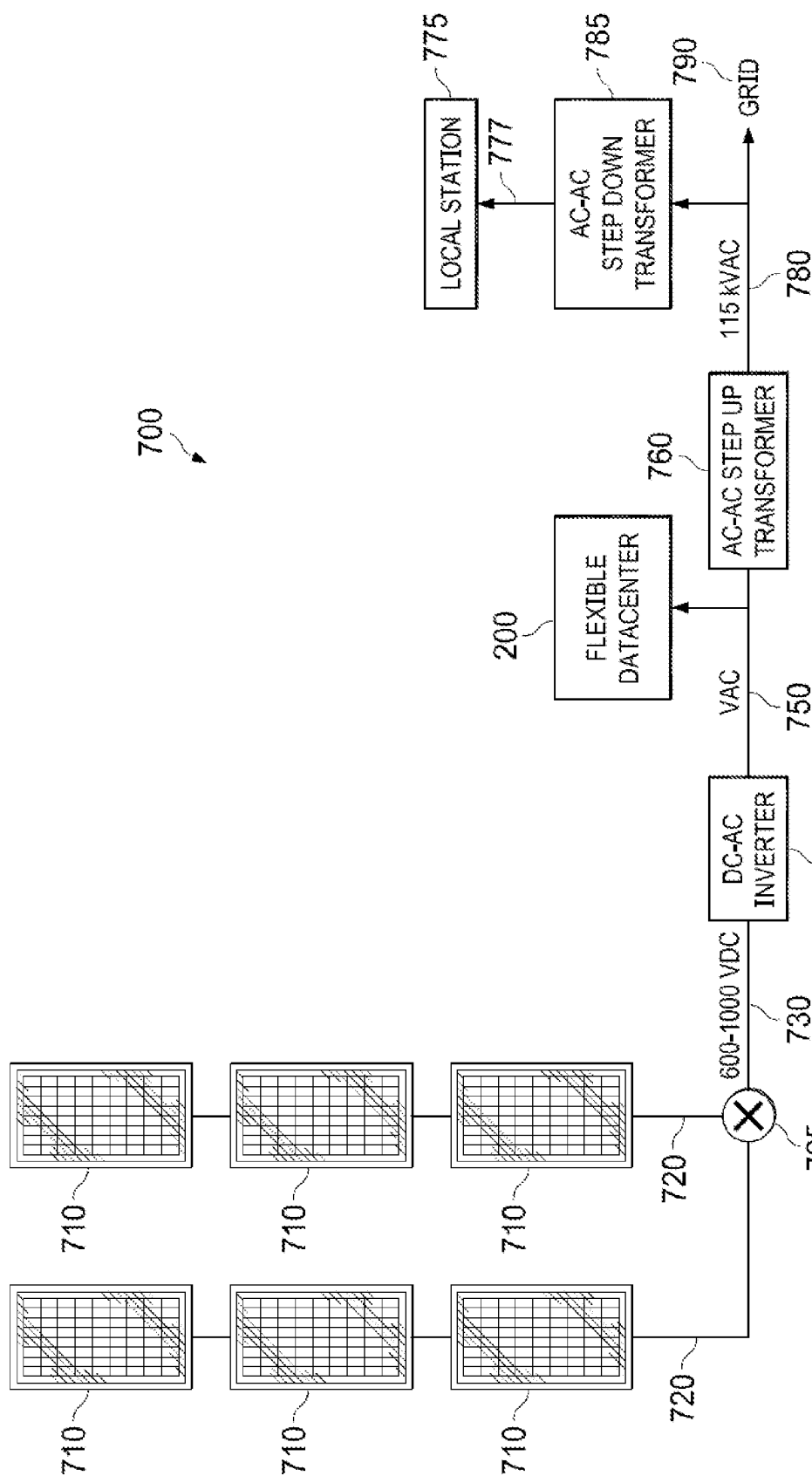
FIG. 7 shows a flexible datacenter powered by one or more solar panels in accordance with one or more embodiments of the present invention.

FIG. 7 shows a flexible datacenter 200 powered by one or more solar panels 710 in accordance with one or more embodiments of the present invention. A solar farm 700 typically includes a plurality of solar panels 710, each of which intermittently generates a solar-generated DC voltage 720. Solar-generated DC voltage 720 may vary based on a type, kind, or configuration of farm 700, panel 710, and incident sunlight. Solar-generated DC voltage 720 produced by the plurality of solar panels 710 is collected 725 and provided 730 to a DC-to-AC inverter 740 that converts solar-generated DC voltage into three-phase solar-generated AC voltage 750. Three-phase solar-generated AC voltage 750 is provided to an AC-to-AC step-up transformer 760 that steps up three-phase solar-generated AC voltage to three-phase grid AC voltage 790. Three-phase grid AC voltage 790 may be stepped down with an AC-to-AC step-down transformer 785 configured to produce three-phase local station AC voltage 777 provided to local station 775. One of ordinary skill in the art will recognize that the actual voltage levels may vary based on the type, kind, or number of solar panels 710, the configuration or design of solar farm 700, and grid 790 that it feeds into. In some embodiments, the solar farm 700 may provide DC power directly to flexible datacenter 200 without a conversion to AC via the DC-to-AC inverter 740.

The output side of AC-to-AC step-up transformer 760 that connects to grid 790 may be metered and is typically subject to transmission and distribution costs. In contrast, power consumed on the input side of AC-to-AC step-up transformer 760 may be considered behind-the-meter and is typically not subject to transmission and distribution costs. As such, one or more flexible datacenters 200 may be powered by three-phase solar-generated AC voltage 750. Specifically, in solar farm 700 applications, the three-phase behind-the-meter AC voltage used to power flexible datacenter 200 may be three-phase solar-generated AC voltage 750. As such, flexible datacenter 200 may reside behind-the-meter, avoid transmission and distribution costs, and may be dynamically powered when unutilized behind-the-meter power is available.

Unutilized behind-the-meter power availability may occur when there is excess local power generation. In high incident sunlight situations, solar farm 700 may generate more power than, for example, AC-to-AC step-up transformer 760 is rated for. In such situations, solar farm 700 may have to take steps to protect its equipment from damage, which may include taking one or more panels 710 offline or shunting their voltage to dummy loads or ground. Advantageously, one or more flexible datacenters 200 may be used to consume power on the input side of AC-to-AC step-up transformer 760, thereby allowing solar farm 700 to operate equipment within operating ranges while flexible datacenter 200 receives behind-the-meter power without transmission or distribution costs. The local station control system (not independently illustrated) of local station 775 may issue an operational directive to the one or more flexible datacenters 200 or to the remote master control system (420 of FIG. 4) to ramp-up to the desired power consumption level. When the operational directive requires the cooperative action of multiple flexible datacenters 200, the remote mater control system (420 of FIG. 4) may determine how to power each individual flexible datacenter 200 in accordance with the operational directive or provide an override to each flexible datacenter 200.

Another example of unutilized behind-the-meter power availability is when grid 790 cannot, for whatever reason, take the power being produced by solar farm 700. In such situations, solar farm 700 may have to take one or more panels 710 offline or shunt their voltage to dummy loads or ground. Advantageously, one or more flexible datacenters 200 may be used to consume power on the input side of AC-to-AC step-up transformer 760, thereby allowing solar farm 700 to either produce power to grid 790 at a lower level or shut down transformer 760 entirely while flexible datacenter 200 receives behind-the-meter power without transmission or distribution costs. The local station control system (not independently illustrated) of local station 775 or the grid operator (not independently illustrated) of grid 790 may issue an operational directive to the one or more flexible datacenters 200 or to the remote master control system (420 of FIG. 4) to ramp-up to the desired power consumption level. When the operational directive requires the cooperative action of multiple flexible datacenters 200, the remote master control system (420 of FIG. 4) may determine how to power each individual flexible datacenter 200 in accordance with the operational directive or provide an override to each flexible datacenter 200.

Another example of unutilized behind-the-meter power availability is when solar farm 700 is selling power to grid 790 at a negative price that is offset by a production tax credit. In certain circumstances, the value of the production tax credit may exceed the price solar farm 700 would have to pay to grid 790 to offload their generated power. Advantageously, one or more flexible datacenters 200 may be used to consume power behind-the-meter, thereby allowing solar farm 700 to produce and obtain the production tax credit, but sell less power to grid 790 at the negative price. The local station control system (not independently illustrated) of local station 775 may issue an operational directive to the one or more flexible datacenters 200 or to the remote master control system (420 of FIG. 4) to ramp-up to the desired power consumption level. When the operational directive requires the cooperative action of multiple flexible datacenter 200, the remote master control system (420 of FIG. 4) may determine how to power each individual flexible datacenter 200 in accordance with the operational directive or provide an override to each flexible datacenter 200.

Another example of unutilized behind-the-meter power availability is when solar farm 700 is selling power to grid 790 at a negative price because grid 790 is oversupplied or is instructed to stand down and stop producing altogether. The grid operator (not independently illustrated) may select certain power generation stations to go offline and stop producing power to grid 790. Advantageously, one or more flexible datacenters 200 may be used to consume power behind-the-meter, thereby allowing solar farm 700 to stop producing power to grid 790, but making productive use of the power generated behind-the-meter without transmission or distribution costs. The local station control system (not independently illustrated) of the local station 775 or the grid operator (not independently illustrated) of grid 790 may issue an operational directive to the one or more flexible datacenters 200 or to the remote master control system (420 of FIG. 4) to ramp-up to the desired power consumption level. When the operational directive requires the cooperative action of multiple flexible datacenters 200, the remote master control system (420 of FIG. 4) may determine how to power each individual flexible datacenter 200 in accordance with the operational directive or provide an override to each flexible datacenter 200.

Another example of unutilized behind-the-meter power availability is when solar farm 700 is producing power to grid 790 that is unstable, out of phase, or at the wrong frequency, or grid 790 is already unstable, out of phase, or at the wrong frequency for whatever reason. The grid operator (not independently illustrated) may select certain power generation stations to go offline and stop producing power to grid 790. Advantageously, one or more flexible datacenters 200 may be used to consume power behind-the-meter, thereby allowing solar farm 700 to stop producing power to grid 790, but make productive use of the power generated behind-the-meter without transmission or distribution costs. The local station control system (not independently illustrated) of local station 775 may issue an operational directive to the one or more flexible datacenters 200 or to the remote master control system (420 of FIG. 4) to ramp-up to the desired power consumption level. When the operational directive requires the cooperative action of multiple flexible datacenters 200, the remote master control system (420 of FIG. 4) may determine how to power each individual flexible datacenter 200 in accordance with the operational directive or provide an override to each flexible datacenter 200.

Further examples of unutilized behind-the-meter power availability is when solar farm 700 experiences intermittent cloud cover such that it is not economically feasible to power up certain components, such as, for example local station 775, but there may be sufficient behind-the-meter power availability to power one or more flexible datacenters 200. Similarly, unutilized behind-the-meter power availability may occur when solar farm 700 is starting up, or testing, one or more panels 710. Panels 710 are frequently offline for installation, maintenance, and service and must be tested prior to coming online as part of the array. One or more flexible datacenters 200 may be powered by one or more panels 710 that are offline from farm 700. The above-noted examples of when unutilized behind-the-meter power is available are merely exemplary and are not intended to limit the scope of what one of ordinary skill in the art would recognize as unutilized behind-the-meter power availability. Behind-the-meter power availability may occur anytime there is power available and accessible behind-the-meter that is not subject to transmission and distribution costs and there is an economic advantage to using it.

One of ordinary skill in the art will recognize that solar farm 700 and solar panel 710 may vary based on an application or design in accordance with one or more embodiments of the present invention.

Figure 8:
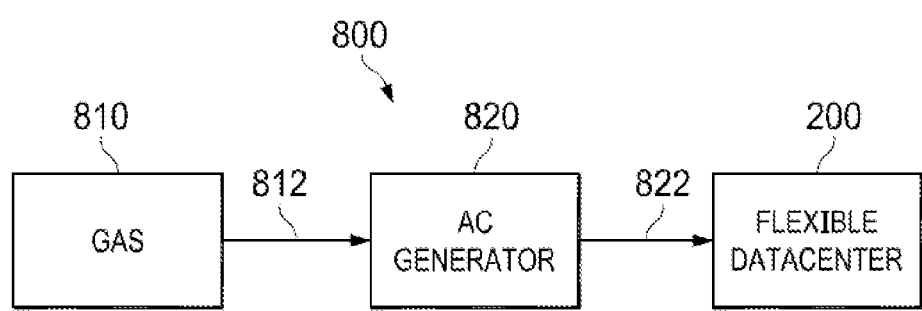
FIG. 8 shows a flexible datacenter powered by flare gas in accordance with one or more embodiments of the present invention.

FIG. 8 shows a flexible datacenter 200 powered by flare gas 800 in accordance with one or more embodiments of the present invention. Flare gas 800 is combustible gas produced as a product or by-product of petroleum refineries, chemical plants, natural gas processing plants, oil and gas drilling rigs, and oil and gas production facilities. Flare gas 800 is typically burned off through a flare stack (not shown) or vented into the air. In one or more embodiments of the present invention, flare gas 800 may be diverted 812 to a gas-powered generator that produces three-phase gas-generated AC voltage 822. This power may be considered behind-the-meter and is not subject to transmission and distribution costs. As such, one or more flexible datacenters 200 may be powered by three-phase gas-generated AC voltage. Specifically, the three-phase behind-the-meter AC voltage used to power flexible datacenter 200 may be three-phase gas-generated AC voltage 822. Accordingly, flexible datacenter 200 may reside behind-the-meter, avoid transmission and distribution costs, and may be dynamically powered when unutilized behind-the-meter power is available.

Figure 9A:
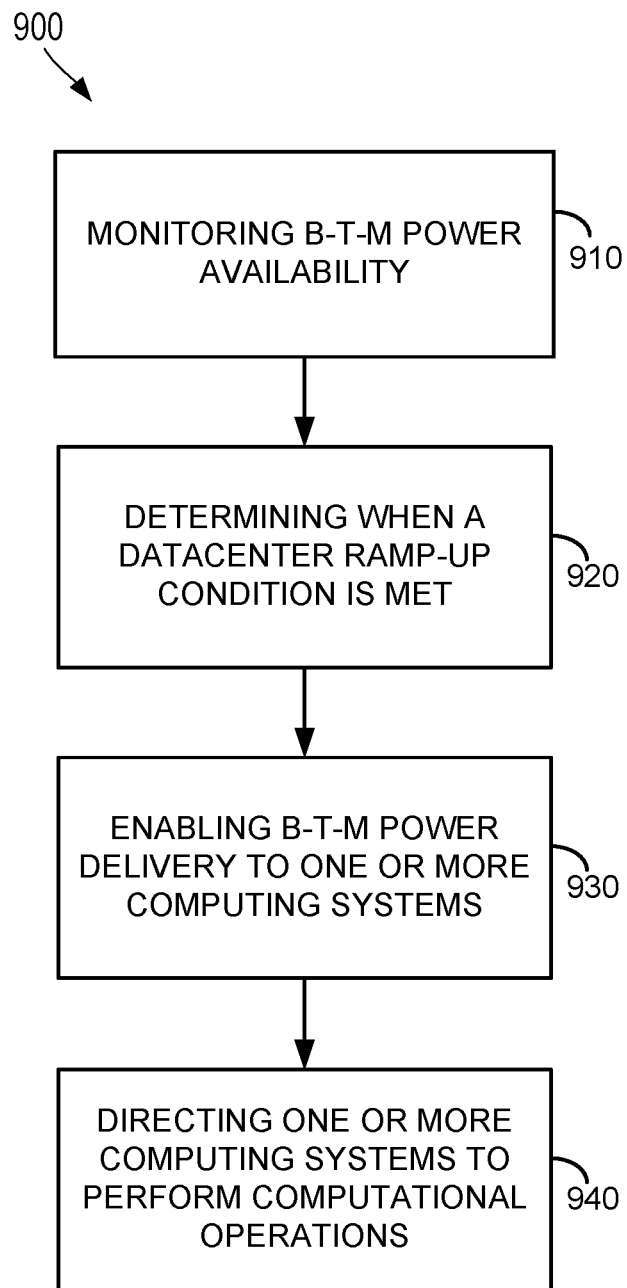
FIG. 9A shows a method of dynamic power delivery to a flexible datacenter using behind-the-meter power in accordance with one or more embodiments of the present invention.

FIG. 9A shows a method of dynamic power delivery to a flexible datacenter (200 of FIG. 2) using behind-the-meter power 900 in accordance with one or more embodiments of the present invention. In step 910, the datacenter control system (220 of FIG. 4), or the remote master control system (420 of FIG. 4), may monitor behind-the-meter power availability. In certain embodiments, monitoring may include receiving information or an operational directive from the local station control system (410 of FIG. 4) or the grid operator (440 of FIG. 4) corresponding to behind-the-meter power availability.

In step 920, the datacenter control system (220 of FIG. 4), or the remote master control system (420 of FIG. 4), may determine when a datacenter ramp-up condition is met. In certain embodiments, the datacenter ramp-up condition may be met when there is sufficient behind-the-meter power availability and there is no operational directive from the local station to go offline or reduce power. In step 930, the datacenter control system (220 of FIG. 4) may enable behind-the-meter power delivery to one or more computing systems (100 of FIG. 2). In step 940, once ramped-up, the datacenter control system (220 of FIG. 4) or the remote master control system (420 of FIG. 4) may direct one or more computing systems (100 of FIG. 2) to perform predetermined computational operations. In certain embodiments, the predetermined computational operations may include the execution of one or more hashing functions.

While operational, the datacenter control system (220 of FIG. 4), or the remote master control system (420 of FIG. 4), may receive an operational directive to modulate power consumption. In certain embodiments, the operational directive may be a directive to reduce power consumption. In such embodiments, the datacenter control system (220 of FIG. 4) or the remote master control system (420 of FIG. 4) may dynamically reduce power delivery to one or more computing systems (100 of FIG. 2) or dynamically reduce power consumption of one or more computing systems. In other embodiments, the operational directive may be a directive to provide a power factor correction factor. In such embodiments, the datacenter control system (220 of FIG. 4) or the remote master control system (420 of FIG. 4) may dynamically adjust power delivery to one or more computing systems (100 of FIG. 2) to achieve a desired power factor correction factor. In still other embodiments, the operational directive may be a directive to go offline or power down. In such embodiments, the datacenter control system (220 of FIG. 4) may disable power delivery to one or more computing systems (100 of FIG. 2).

Figure 9B:
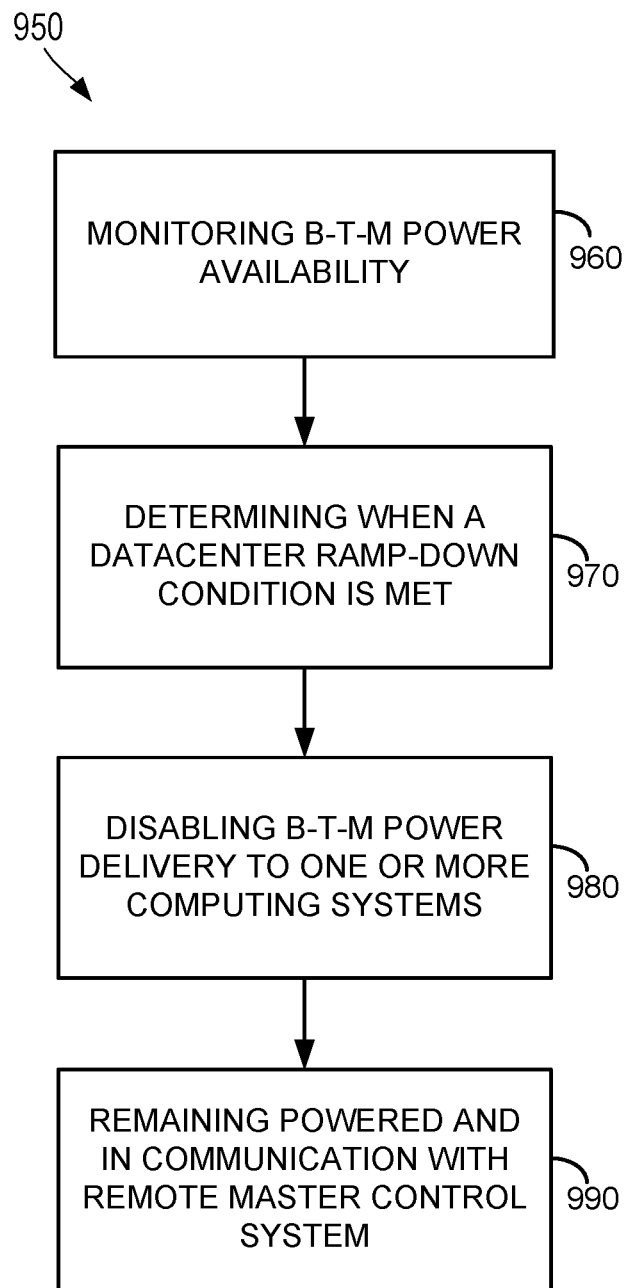
FIG. 9B shows another method of dynamic power delivery to a flexible datacenter using behind-the-meter power in accordance with one or more embodiments of the present invention.

As such, FIG. 9B shows a method of dynamic power delivery to a flexible datacenter (200 of FIG. 2) using behind-the-meter power 950 in accordance with one or more embodiments of the present invention. In step 960, the datacenter control system (220 of FIG. 4), or the remote master control system (420 of FIG. 4), may monitor behind-the-meter power availability. In certain embodiments, monitoring may include receiving information or an operational directive from the local station control system (410 of FIG. 4) or the grid operator (440 of FIG. 4) corresponding to behind-the-meter power availability.

In step 970, the datacenter control system (220 of FIG. 4), or the remote master control system (420 of FIG. 4), may determine when a datacenter ramp-down condition is met. In certain embodiments, the datacenter ramp-down condition may be met when there is insufficient behind-the-meter power availability or anticipated to be insufficient behind-the-meter power availability or there is an operational directive from the local station to go offline or reduce power. In step 980, the datacenter control system (220 of FIG. 4) may disable behind-the-meter power delivery to one or more computing systems (100 of FIG. 2). In step 990, once ramped-down, the datacenter control system (220 of FIG. 4) remains powered and in communication with the remote master control system (420 of FIG. 4) so that it may dynamically power the flexible datacenter (200 of FIG. 2) when conditions change.

One of ordinary skill in the art will recognize that a datacenter control system (220 of FIG. 4) may dynamically modulate power delivery to one or more computing systems (100 of FIG. 2) of a flexible datacenter (200 of FIG. 2) based on behind-the-meter power availability or an operational directive. The flexible datacenter (200 of FIG. 2) may transition between a fully powered down state (while the datacenter control system remains powered), a fully powered up state, and various intermediate states in between. In addition, flexible datacenter (200 of FIG. 2) may have a blackout state, where all power consumption, including that of the datacenter control system (220 of FIG. 4) is halted. However, once the flexible datacenter (200 of FIG. 2) enters the blackout state, it will have to be manually rebooted to restore power to datacenter control system (220 of FIG. 4). Local station conditions or operational directives may cause flexible datacenter (200 of FIG. 2) to ramp-up, reduce power consumption, change power factor, or ramp-down.

Figure 10:
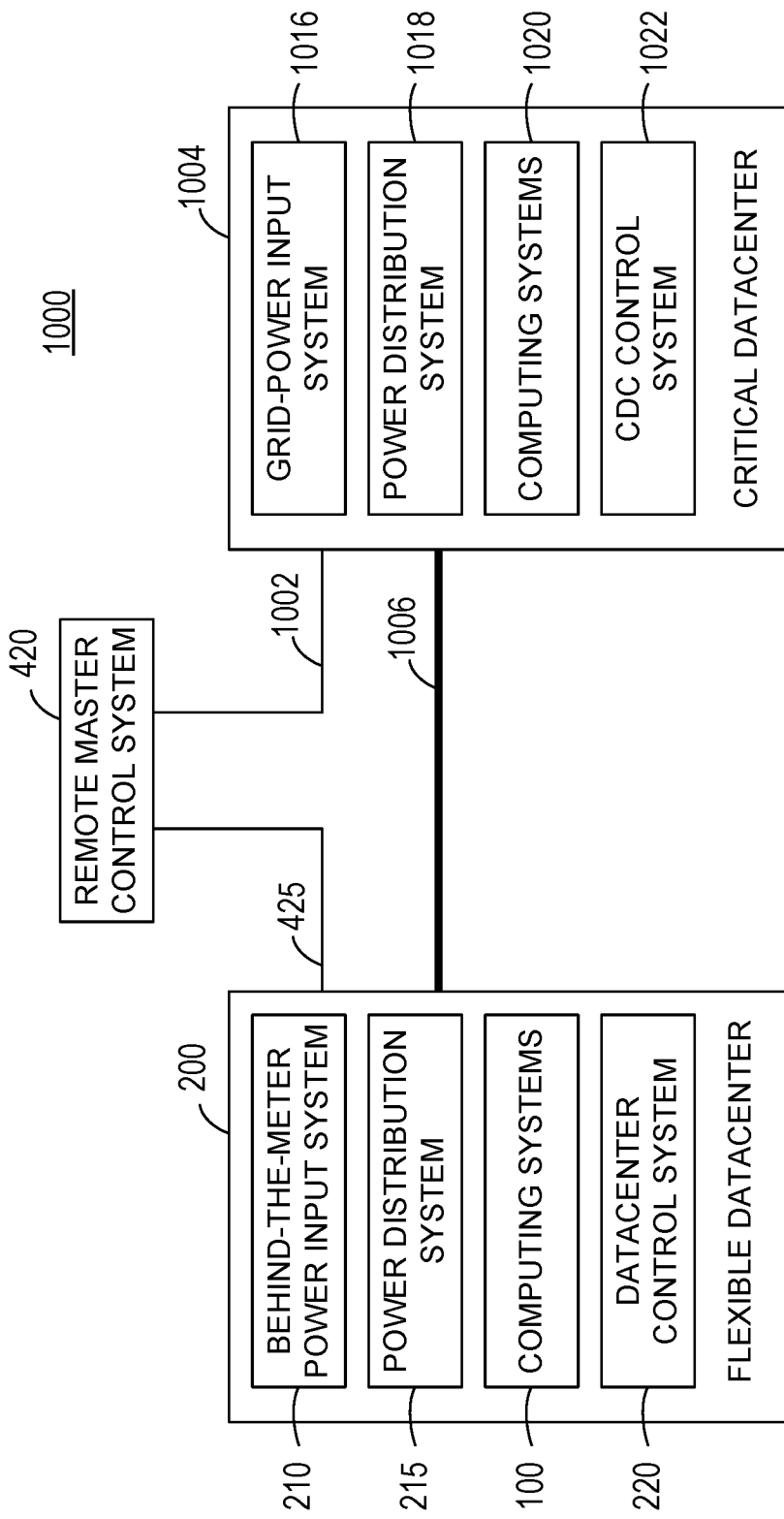
FIG. 10 illustrates an example system for managing a critical datacenter coupled to behind-the-meter flexible datacenters in accordance with one or more embodiments of the present invention.

FIG. 10 illustrates an example system for managing a critical datacenter coupled to behind-the-meter flexible datacenters in accordance with one or more embodiments of the present invention. System 1000 includes flexible datacenter 200, critical datacenter 1004, communication link 1006, and remote master control system 420. System 1000 represents an example configuration scheme for a system that can distribute computing operations between the critical datacenter 1004 and one or more flexible datacenters (e.g., flexible datacenter 200). In other examples, system 1000 may include more or fewer components in other potential configurations.

System 1000 may be configured to manage computational operations assigned to critical datacenter 1004. In particular, one or more components within system 1000 may be configured to identify situations that may arise where using flexible datacenter 200 can reduce costs or increase productivity of system 1000, as compared to using critical datacenter 1004 for computational operations. For example, a component within system 1000 may identify when using behind-the-meter power to power computing systems 100 within flexible datacenter 200 is at a lower cost compared to using computing systems 1020 within critical datacenter 1004, which are powered by grid power. Additionally, a component in system 100 may be configured to determine situations when offloading computational operations from critical datacenter 1004 to flexible datacenter 200 can increase the performance allotted to the computational operations requested by an enterprise (e.g., reduce the time required to complete time-sensitive computational operations).

Within system 1000, flexible datacenter 200 may represent one or more flexible datacenters capable of offering computational processing and other computing resources using behind-the-meter power from behind-the-meter sources, such as illustrated in FIGS. 6, 7, and 8. As shown in FIG. 10, flexible datacenter 200 may include behind-the-meter power input system 215 that is connected to a behind-the-meter power source, power distribution system 215, computing systems 100, and datacenter control system 220, and may take the form of a mobile container or another configuration. Additionally, flexible datacenter 200 may include other components not shown in FIG. 10, such as a climate control system.

In some examples, flexible datacenter 200 may be collocated with critical datacenter 1004. For instance, one or more flexible datacenters 200 may be positioned in the same general location as critical datacenter 1004. In other examples, flexible datacenter 200 and critical datacenter 1004 are not collocated. Particularly, one or more flexible datacenters 200 within the system 1000 can have a different location from critical datacenter 1004. In further examples, one or more flexible datacenters 200 can share a location with critical datacenter 1004 while other flexible datacenters 200 can have a location away from critical datacenter 1004.

In order to provide computing resources to support computational operations, flexible datacenter 200 may be deployed near or otherwise connected to one or more sources of behind-the-meter power generation. For instance, one or more flexible datacenters 200 may be connected behind-the-meter to wind farm 600, solar farm 700, and/or other potentially intermittent power generation sources. As such, behind-the-meter power input system 210 may be configured to receive behind-the-meter power from one or more sources and input the power to flexible datacenter 200. For example, behind-the-meter power input system 210 may provide three-phase nominal AC voltage to power distribution system 215. Power distribution system 215 may controllably provide a single phase of three-phase nominal AC voltage to computing systems 100 of flexible datacenter 200. For instance, power distribution system 215 may distribute power to computing systems 100 individually or according to groups of computing systems. Computing systems 100 may then use the power received from the behind-the-meter sources to provide processing/computing abilities, networking, storage, and other resources. In some examples, computing systems 100 may include one or more ASIC computing systems, GPU computing systems, and/or CPU computing systems.

In some examples, power received at flexible datacenter 200 may actively switch between different behind-the-meter sources. For example, flexible datacenter 200 may actively switch from receiving power from either or both wind farm 600 and solar farm 700 (or other types of sources). A computing system associated with flexible datacenter 200 (e.g., datacenter control system 220) or associated with system 1000 (e.g., remote master control system 420) generally may monitor various input signals, such as, but not limited to, the price for power, availability of power, computing analysis, and order from an operator, etc., to determine which sources to receive power from at a given time. In some situations, the computing system may determine that no source is currently a viable option for supplying power to flexible datacenter 200. Other sources of behind-the-meter power or grid power can also be used to power flexible datacenter 200 within examples. For example, flexible datacenter may receive grid power from the local station where it is cited.

System 1000 includes critical datacenter 1004, which represents one or more datacenters assigned to provide computational resources to fulfill critical operations. Particularly, critical datacenter 1004 may receive one or more assignments to support computational operations from an enterprise. As a result, critical datacenter 1004 is preferably connected to a power grid to ensure that reliable power is available. Critical datacenter 1004 may include grid-power input system 1016, power distribution system 1018, critical datacenter control system 1022, and computing systems 1020. Grid-power input system 1016 may be configured to receive power from a power grid and distribute the power to computing systems 1020 via power distribution system 1018. In some embodiments, critical datacenter control system 1022 can manage the assignment and support of computational operations received from enterprises, including the distribution of computational operations among flexible datacenter 200 and critical datacenter 1004. This is further described below with respect to remote master control system 420, and management operations described with respect to remote master control system 420 may alternatively or additionally be handled by critical datacenter control system 1022.

Communication link 1006 represents one or more links that may serve to connect flexible datacenter 200, critical datacenter 1004, and other components within system 1000 (e.g., remote master control system 420—connection not shown). In particular, communication link 1006 may enable direct or indirect communication between flexible datacenter 200 and critical datacenter 1004. The type of communication link 1006 may depend on the locations of flexible datacenter 200 and critical datacenter 1004. Within embodiments, different types of communication links can be used, including but not limited to WAN connectivity, cloud-based connectivity, and wired and wireless communication links.

Remote master control system 420 represents a component within system 1000 that, in some embodiments, can manage the assignment and support of computational operations received from enterprises, including the distribution of computational operations among flexible datacenter 200 and critical datacenter 1004. As shown in FIG. 10, remote master control system 420 may connect to flexible datacenter 200 and critical datacenter 1004 via communication link 1002. Alternatively or additionally, remote master control system 420 may connect to flexible datacenter 200 and critical datacenter 1004 via communication link 1006 (not shown). In some embodiments, remote master control system 420 may serve as an intermediary that facilitates all communication between flexible datacenter 200 and critical datacenter 1004. Particularly, critical datacenter 1004 or flexible datacenter 200 might need to transmit communication to remote master control system 420 in order to communicate with the other datacenter.

Remote master control system 420 may assist with management of operations assigned to one or both of flexible datacenter 200 and critical datacenter 1004. For instance, remote master control system 420 may be configured to monitor input signals from behind-the-meter sources in order to identify situations where utilizing flexible datacenter 200 can reduce costs or increase efficiency of system 1000. For instance, remote master control system 420 may determine when flexible datacenter 200 could use power from one or more behind-the-meter power sources to supplement the computing resources offered by critical datacenter 1004.

As an example, remote master control system 420 (or another component within system 1000) may determine when unutilized power from a behind-the-meter source is being sold at a negative price back to the grid. As another example, remote master control system 420 may monitor power system conditions and issue operational directives to the flexible datacenter. Operational directives may include, but are not limited to, a local station directive, a remote master control directive, a grid directive, a dispatchability directive, a forecast directive, a workload directive based on actual behind-the-meter power availability or projected behind-the-meter power availability. Power system conditions, which may be additionally or alternatively be monitored by one or more of the control systems 220, 420, and/or 1020 may include, but are not limited to, excess local power generation at a local station level, excess local power generation that a grid cannot receive, local power generation subject to economic curtailment, local power generation subject to reliability curtailment, local power generation subject to power factor correction, low local power generation, start up local power generation situations, transient local power generation situations, or testing local power generation situations where there is an economic advantage to using local behind-the-meter power generation. As another example, remote master control system 420 (or critical datacenter control system 1022) may monitor the types of computational operations requested of the critical datacenter 1004 and make determinations alone or in conjunction with other control systems, power system conditions, and/or operational directives to decide when or how to offload computational operations to a flexible datacenter 200.

As a result, the remote master control system 420 may offload some or all of the computational operations assigned to critical datacenter 1004 to flexible datacenter 200. This way, flexible datacenter 200 can reduce overall computational costs by using the behind-the-meter power to provide computational resources to assist critical datacenter 1004. Flexible datacenter 200 consumes behind-the-meter power without transmission or distribution costs, which lowers the costs associated with performing computational operations originally assigned to critical datacenter 1004. In further examples, remote master control system 420 may identify other situations that may benefit from using one or more flexible datacenters (e.g., flexible datacenter 200) to supplement or replace computational resources provided by critical datacenter 1004.

In some examples, remote master control system 420 may facilitate communication among components within system 1000 using communication links 425, 1002, and/or 1006. The communications may include computation requests from components within system 1000. In one embodiment, the remote master control system 420 may identify a computational operation to be performed at a critical datacenter 1004. The computational operation may be identified by querying the critical datacenter 1004 or by receiving a request from the critical datacenter 1004. Information regarding active or requested computational operations at the critical datacenter 1004 may be considered as part of the identification process. The communications may also include a variety of other information, such as an indication of a current workload at critical datacenter 1004, a current status of operation at critical datacenter 1004 (e.g., a report indicating current capacity available and power consumption at critical datacenter 1004). Upon receiving the information, remote master control system 420 may determine whether to route the computational operations to flexible datacenter 200.

The determination process may involve considering various factors, including power availability and associated costs from the power grid and behind-the-meter sources, availability of flexible datacenter 200, and type and deadlines associated with assigned computational operations, among others. In some situations, remote master control system 420 may then send the computational operation to flexible datacenter 200 via communication link 1006. In these situations, remote master control system 420 may determine that utilizing flexible datacenter 200 could enhance the operation of system 1000 overall. Particularly, using flexible datacenter 200 may reduce costs and increase efficiency of system 1000. Flexible datacenter 200 may also help reduce the amount of unutilized power being produced by one or more behind-the-meter sources.

In some examples, remote master control system 420 may reassign computational operations from critical datacenter 1004 over to flexible datacenter 200 for flexible datacenter 200 to support or complete. For instance, remote master control system 420 may determine that using flexible datacenter 200 is more cost efficient that only using critical datacenter 1004. In further examples, remote master control system 420 may determine that flexible datacenter 200 is available to support and provide computing resources to new computational operations received from an enterprise. This way, remote master control system 420 may route the new computational operations directly to flexible datacenter 200 without impacting the workload on critical datacenter 1004.

When determining whether to route a computational operation to flexible datacenter 200, remote master control system 420 may be configured to consider different factors, such as the availability of flexible datacenter 200 and availability of behind-the-meter power. In some situations, remote master control system 420 or another component within system 1000 may determine that flexible datacenter 200 might not have enough computing systems 100 available to satisfy the computational operation. As a result, remote master control system 420 may refrain from sending the computational operation to flexible datacenter 200. Remote master control system 420 may then transmit an indication that flexible datacenter 200 is unavailable back to critical datacenter 1004. In some examples, remote master control system 420 may further analyze the workloads of other flexible datacenters to identify a flexible datacenter that is capable of handling the computational operation. Upon identifying an available flexible datacenter, remote master control system 420 may transmit the computational operation to that flexible datacenter instead. In further examples, remote master control system 420 may divide operations associated with one or more identified computational operation among multiple flexible datacenters.

In some examples, remote master control system 420 may determine whether to route a computational operation to flexible datacenter 200 based on the availability of between-the-meter power for flexible datacenter 200. Additionally or alternatively, remote master control system 420, flexible datacenter control system 220, or another computing device may monitor one or more other power system operation conditions to make the determination. Remote master control system 420 may also determine whether a datacenter ramp-up condition is met when determining whether to route a computational operation to flexible datacenter 200. For instance, remote master control system 420 may check whether flexible datacenter 200 is ramped-up to a fully online status, ramped-down to a fully offline status, or in another state (e.g., acting as a load balancer). As such, remote master control system 420 may determine whether to route a computation request to flexible datacenter 200 based on the status of flexible datacenter 200.

As previously discussed, system 1000 may include a flexible datacenter control system 220, which may be configured to modulate power delivery to computing systems 100 of flexible datacenter 200. For example, the flexible datacenter control system 220 may modulate power delivery to computing systems 100 based on a threshold level of unutilized behind-the-meter power availability or some other monitored power system condition. In some instances, the flexible datacenter control system 220 may be configured to modulate power delivery to computing systems 100 by selectively enabling a subset of computing systems 100.

The flexible datacenter control system 220 may alternatively or additionally be configured to modulate power delivery to computing systems 100 based on an operational directive. For instance, the flexible datacenter control system 220 or another system may receive an operational directive from a user interface to modulate the power delivery to computing systems 100. As discussed above, the operational directive may be a local station directive, a remote master control directive, a grid directive, a dispatchability directive, or a forecast directive. In some instances, the operational directive may also include a workload directive based on a threshold level actual behind-the-meter power availability or a threshold level of projected behind-the-meter power availability.

Figure 11:
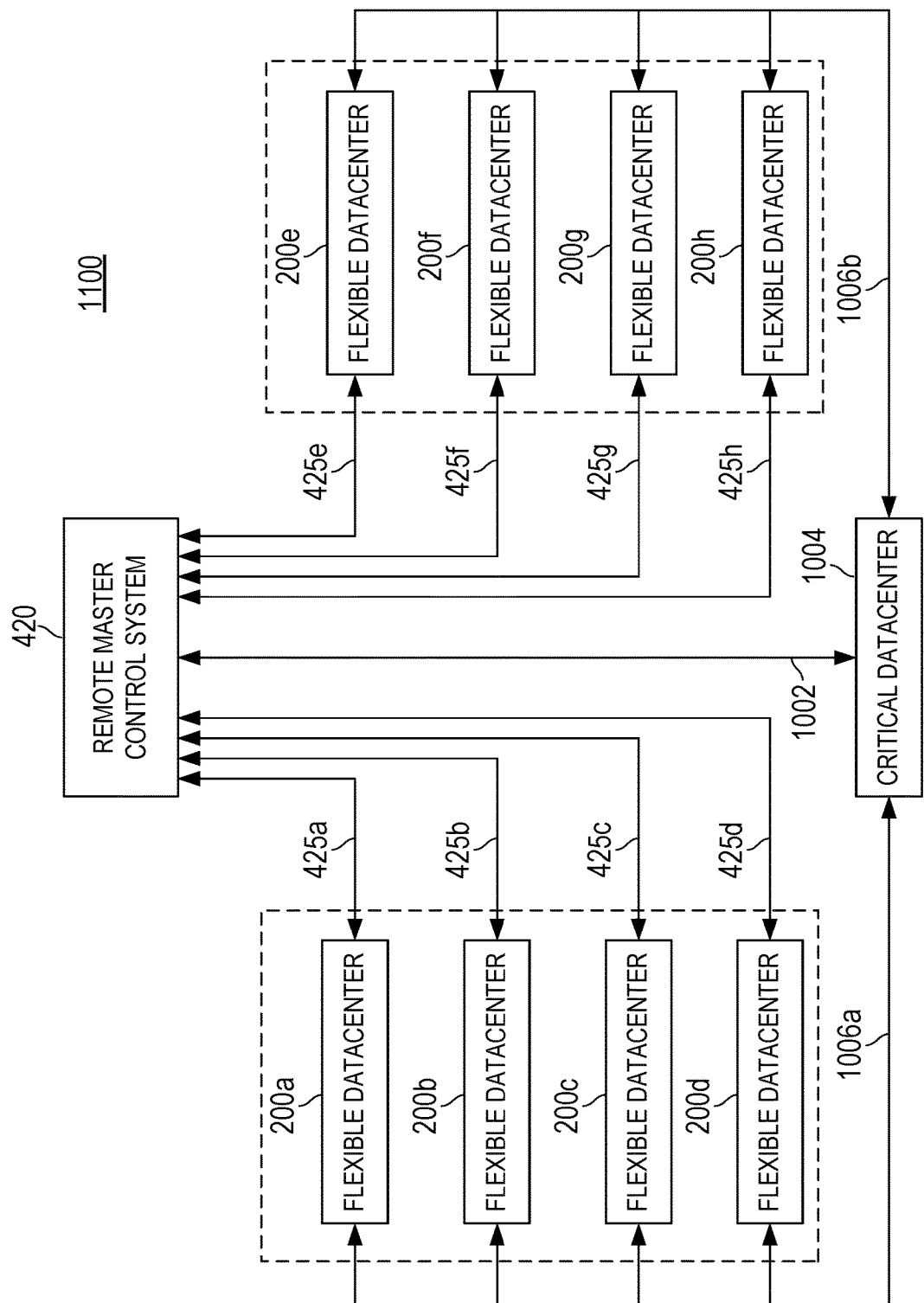
FIG. 11 illustrates a control distribution for managing a critical datacenter coupled to a plurality of behind-the-meter flexible datacenters in accordance with one or more embodiments of the present invention.

FIG. 11 illustrates a control distribution for managing a critical datacenter coupled to a plurality of behind-the-meter flexible datacenters in accordance with one or more embodiments of the present invention. The system 1100 is similar to the schemes illustrated in FIG. 5, with the addition of critical datacenter 1004, and communication links 1002, 1006*a*, and 1006*b*. Local stations 410*a* and 410*b*, and other control paths not required for illustrative purposes, are removed for clarity. Components and aspects illustrated and/or described in FIG. 10 that are similar or the same as components or aspects illustrated and/or described in FIG. 5 should be considered to have the same characteristics as previously illustrated and/or described.

In some embodiments, remote master control system 420 may be configured to determine whether to route a computational operation to a particular flexible datacenter (e.g., flexible datacenter 200) from among multiple flexible datacenters. The determination process may involve initially determining whether to route the computational operation to a flexible datacenter and then further selecting a specific flexible datacenter to route the computational operation to. Remote master control system 420 or another component (e.g., one or more flexible datacenter control systems 220) may be configured to determine a cost of execution of the computing instructions by computing systems at the specific flexible datacenter. Particularly, each flexible datacenter may be capable of providing computing resources at different costs based on various factors, such as the locations of the flexible datacenters 200 and the availability of behind-the-meter power to each flexible datacenter (i.e., flexible datacenters 200 may connect to different behind-the-meter power sources). As such, remote master control system 420 may be configured to consider the different factors to select a specific flexible datacenter to use to fulfill a computational operation.

Figure 12:
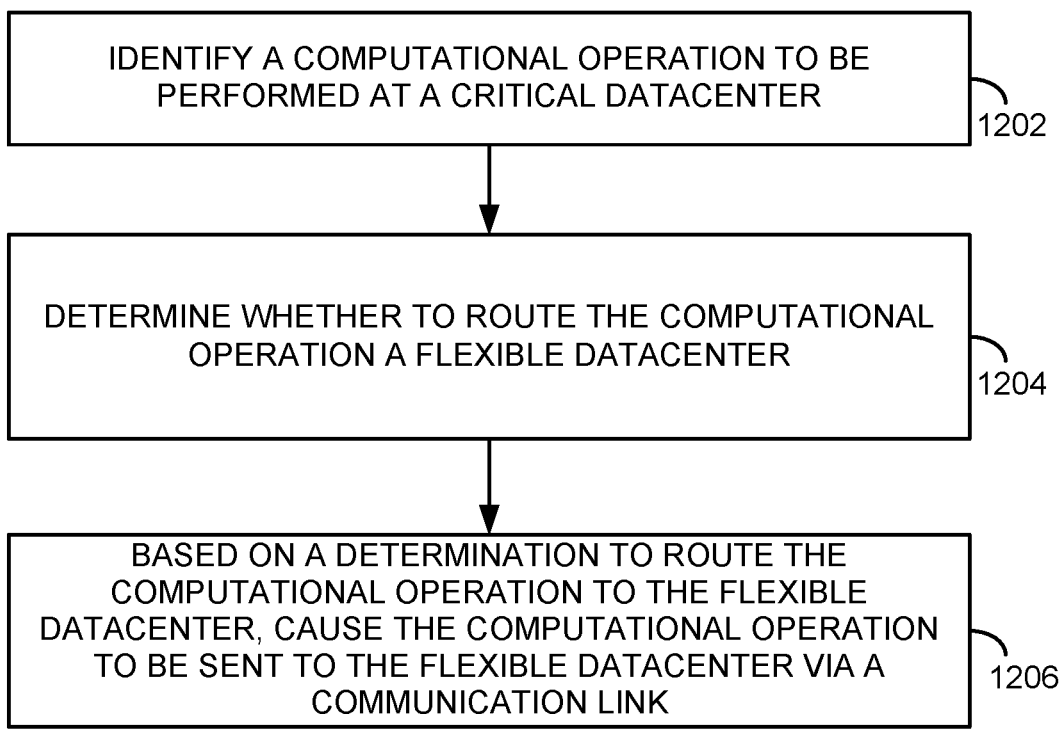
FIG. 12 illustrates a method for shared computation between a critical datacenter and a flexible datacenter in accordance with one or more embodiments of the present invention.

FIG. 12 illustrates a method for shared computation between a critical datacenter and a flexible datacenter in accordance with one or more embodiments of the present invention. The method serves an example and may include other steps within other examples. At step 1202, the method involves identifying a computational operation to be performed at a critical datacenter. For instance, a component within system 1000 may identify a computational operation to be performed at a critical datacenter 1004. Identifying the computational operation can include examining various types of information, such as a request for processing, networking, or storage capabilities or a request to offload some work from the critical datacenter. In some instances, the computational operation may be identified in association with an incoming computational operation request received from an outside enterprise.

At step 1204, the method involves determining whether to route the computational operation to a flexible datacenter. Different components may be configured to determine whether to route the computational operation to a flexible datacenter. For example, remote master control 420 or critical datacenter control system 1022 within system 1000 may be configured to determine whether to route the computational operation to flexible datacenter 1002. In other examples, a flexible datacenter control system 220 may determine whether to route the computational operation to flexible datacenter 1002. In further examples, other components can perform the determination step.

Determining whether to route the computational operation to a flexible datacenter, such as flexible datacenter 200, can involve considering various factors, such as a cost of execution to provide computing resources at the flexible datacenter relative to the cost of providing computing resources at the critical datacenter. The determination may also factor the availability of the flexible datacenter as well as the cost and availability of unutilized behind-the-meter power from one or more behind-the-meter sources. Other factors can be considered within examples, such as monitored power system conditions and operational directives.

At step 1206, the method involves causing the computational operation to the flexible datacenter via a communication link, such as links 1006, 425, and/or 1002, based on a determination to route the computational operation to the flexible datacenter. Sending the computational operation may enable computing systems of the flexible datacenter to provide computing resources to fulfill the request.

Figure 13:
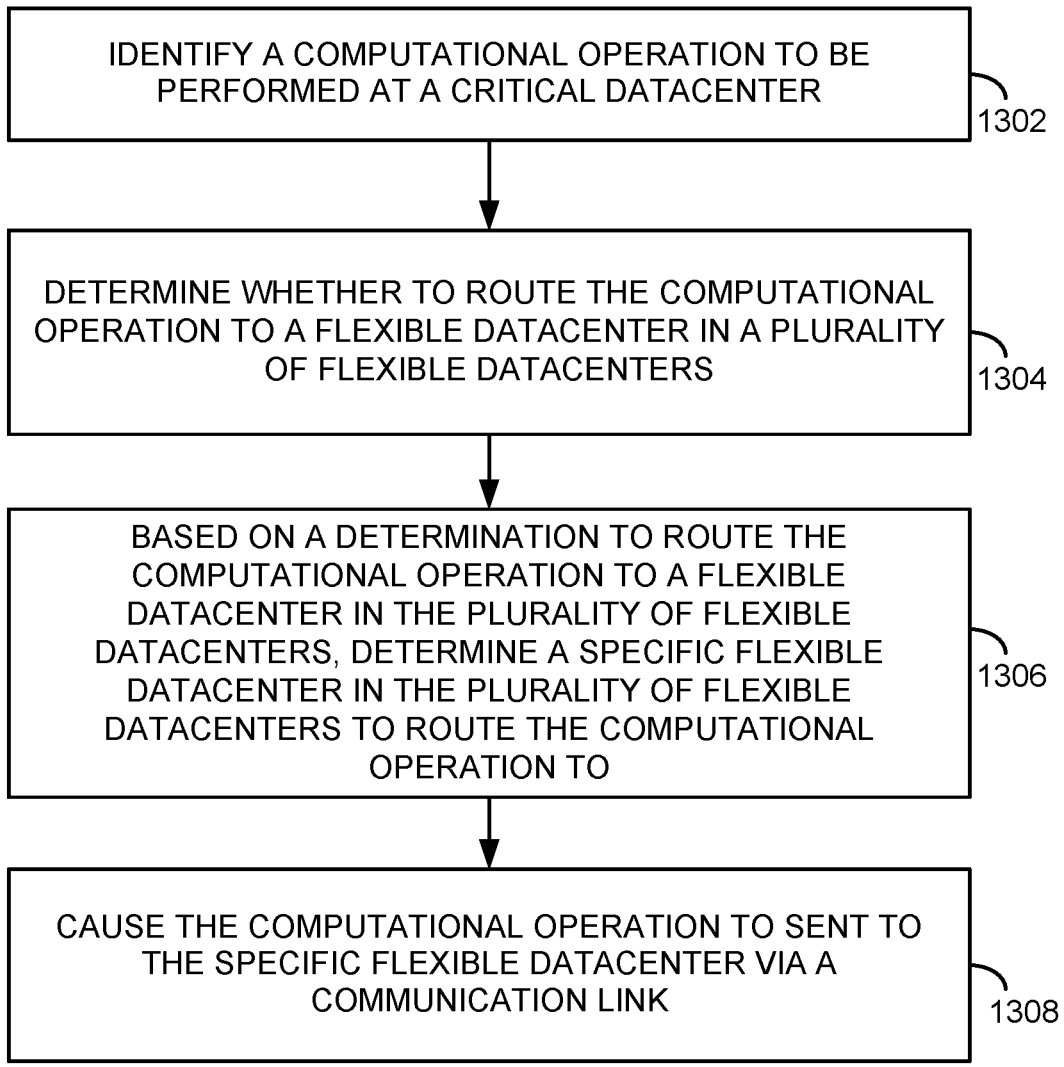
FIG. 13 illustrates a method for shared computation between a critical datacenter and a plurality of flexible datacenters in accordance with one or more embodiments of the present invention.

FIG. 13 illustrates a method for shared computation between a critical datacenter and a plurality of flexible datacenters in accordance with one or more embodiments of the present invention. The method serves an example and may include other steps within other examples. The method of FIG. 13 is similar to the method of FIG. 12, and steps, components, and aspects illustrated and/or described in FIG. 13 that are similar to or the same as components or aspects illustrated and/or described in FIG. 12 should be considered to have the same characteristics as previously illustrated and/or described.

At step 1302, the method involves identifying a computational operation to be performed. The computational operation may be performed at a critical datacenter. At step 1304, the method involves determining whether to route the computational operation to a flexible datacenter in a plurality of flexible datacenters. However, in particular, multiple flexible datacenters may be available to receive the computational operation. As such, a computing system, such as remote master control system 420 or critical datacenter control system 1022, may determine whether to route the computational operation to a flexible datacenter out of the multiple available.

At step 1306, the method involves, based on a determination to route the computational operation to a flexible datacenter in the plurality of flexible datacenters, determining a specific flexible datacenter in the plurality of flexible datacenters to route the computational operation to. The computing system may select a specific datacenter based on cost, availability, source of unutilized behind-the-meter power, or other factors. For example, the computing system may compare the cost associated with sending the computational operation to different flexible datacenters. At step 1308, the method involves causing the computational operation to be sent to the specific flexible datacenter via the communication link.

In further examples, the method described above may involve dividing the computational operation among multiple flexible datacenters.

Advantages of one or more embodiments of the present invention may include one or more of the following:

One or more embodiments of the present invention provides a green solution to two prominent problems: the exponential increase in power required for growing blockchain operations and the unutilized and typically wasted energy generated from renewable energy sources.

One or more embodiments of the present invention allows for the rapid deployment of mobile datacenters to local stations. The mobile datacenters may be deployed on site, near the source of power generation, and receive unutilized behind-the-meter power when it is available.

One or more embodiments of the present invention allows for the power delivery to the datacenter to be modulated based on conditions or an operational directive received from the local station or the grid operator.

One or more embodiments of the present invention may dynamically adjust power consumption by ramping-up, ramping-down, or adjusting the power consumption of one or more computing systems within the flexible datacenter.

One or more embodiments of the present invention may be powered by behind-the-meter power that is free from transmission and distribution costs. As such, the flexible datacenter may perform computational operations, such as hashing function operations, with little to no energy cost.

One or more embodiments of the present invention provides a number of benefits to the hosting local station. The local station may use the flexible datacenter to adjust a load, provide a power factor correction, to offload power, or operate in a manner that invokes a production tax credit and/or generates incremental revenue.

One or more embodiments of the present invention allows for continued shunting of behind-the-meter power into a storage solution when a flexible datacenter cannot fully utilize excess generated behind-the-meter power.

One or more embodiments of the present invention allows for continued use of stored behind-the-meter power when a flexible datacenter can be operational but there is not an excess of generated behind-the-meter power.

It will also be recognized by the skilled worker that, in addition to improved efficiencies in controlling power delivery from intermittent generation sources, such as wind farms and solar panel arrays, to regulated power grids, the invention provides more economically efficient control and stability of such power grids in the implementation of the technical features as set forth herein.

While the present invention has been described with respect to the above-noted embodiments, those skilled in the art, having the benefit of this disclosure, will recognize that other embodiments may be devised that are within the scope of the invention as disclosed herein. Accordingly, the scope of the invention should be limited only by the appended claims.

What is claimed is:

1. A system comprising
a flexible datacenter comprising:
 a first power input system configured to receive power from a power generation system prior to the power undergoing step-up transformation for transmission to a power grid,
 a first power distribution system, and
 a first plurality of computing systems powered by the first power input system via the first power distribution system;
a flexible datacenter control system, wherein the flexible datacenter control system is configured to modulate power delivery to the first plurality of computing systems based on one or more monitored power system conditions or an operational directive;

a critical datacenter comprising:
  a second power input system configured to receive power from the power grid,
  a second power distribution system, and
  a second plurality of computing systems powered by the grid-power input system via the second power distribution system;
a communication link between the flexible datacenter and the critical datacenter; and
a routing control system configured to (i) identify a computational operation to be performed, (ii) determine whether or not to assign the computational operation to the flexible datacenter, and (iii) based on a determination to assign the computational operation to the flexible datacenter, cause the computational operation to be sent to the flexible datacenter via the communication link,
wherein configured to determine whether or not to assign the computational operation to the flexible datacenter via the communication link comprises configured to determine whether the flexible datacenter has enough computing resources to satisfy the computational operation.

2. The system of claim 1, wherein the routing control system comprises a remote master control system.

3. The system of claim 2, wherein the remote master control system is not collocated with the flexible datacenter.

4. The system of claim 2, wherein the remote master control system is not collocated with the critical datacenter.

5. The system of claim 1, wherein the routing control system is configured to reassign one or more computational operations from the critical datacenter for completion by the flexible datacenter.

6. The system of claim 1, wherein the routing control system and a critical datacenter control system are a single control system.

7. The system of claim 1, wherein configured to determine whether the flexible datacenter has enough available computing resources to satisfy the computational operation comprises configured to analyze workloads of the flexible datacenter and identify whether the flexible datacenter has sufficient computing resources to process the computational operation.

8. The system of claim 1, wherein configured to determine whether to route the computational operation to the flexible datacenter via the communication link comprises configured to determine behind-the-meter power availability at the flexible datacenter.

9. The system of claim 1, wherein configured to determine whether to route the computational operation to the flexible datacenter via the communication link comprises configured to determine whether a ramp-up condition associated with the flexible datacenter is met.

10. The system of claim 9, wherein the ramp-up condition comprises one or more of a fully online status or a fully offline status.

11. A system comprising
a plurality of flexible datacenters, each flexible datacenter comprising:
  a first power input system configured to receive power from a power generation system prior to the power undergoing step-up transformation for transmission to a power grid,
  a first power distribution system, and
  a first plurality of computing systems powered by the first power input system;
a flexible datacenter control system, wherein the flexible datacenter control system is configured to modulate power delivery to at least one of the first plurality of computing systems based on one or more monitored power system conditions or an operational directive;
a critical datacenter comprising:
  a second power input system,
  a second power distribution system, and
  a second plurality of computing systems powered by the second power input system via the second power distribution system;
a communication link between the plurality of flexible datacenter and the critical datacenter; and
a routing control system configured to (i) receive a computational operation, (ii) determine whether or not to route the computational operation to a flexible datacenter of the plurality of flexible datacenters, (iii) based on a determination to route the computational operation to a flexible datacenter of the plurality of flexible datacenters, determine a specific flexible datacenter of the plurality of flexible datacenters to which to route the computational operation, and (iv) cause the computational operation to be sent to the specific flexible datacenter via the communication link;
wherein configured to determine a specific flexible datacenter in the plurality of flexible datacenters to which to route the computational operation comprises determining which of the plurality of flexible datacenters has enough computing resources available to satisfy the computational operation.

12. The system of claim 11, wherein the routing control system comprises a remote master control system.

13. The system of claim 12, wherein the remote master control system is not collocated with the flexible datacenter.

14. The system of claim 12, wherein the remote master control system is not collocated with the critical datacenter.

15. The system of claim 11, wherein configured to determine which of the plurality of flexible datacenters has enough computing resources available to process the computational operation comprises configured to analyze workloads of the plurality of the flexible datacenters and to identify one or more specific flexible datacenters having sufficient computing resources to process the computational operation.

16. The system of claim 11, wherein the routing control system is configured to reassign one or more computational operations from the critical datacenter for completion by one or more flexible datacenters of the plurality of flexible datacenters.

17. The system of claim 11, wherein configured to cause the computational operation to be sent to one or more flexible datacenters of the plurality of flexible datacenters via the communication link comprises configured to divide the computational operation among multiple flexible datacenters of the plurality of flexible datacenters.

18. The system of claim 11, further comprising a remote master control system communicatively coupled to the flexible datacenter via a second communication link, wherein the computational operation does not travel on the second communication link.

19. The system of claim 11, wherein configured to determine a specific flexible datacenter in the plurality of flexible datacenters to which to route the computational operation to comprises configured to determine the specific flexible datacenter to route the computational operation to based on behind-the-meter power availability to the plurality of flexible datacenters.

20. The system of claim 11, wherein configured to determine which of the plurality of flexible datacenters has enough computing resources available to satisfy the computational operation comprises configured to determine whether a ramp-up condition and/or a ramp-down condition is associated with one or more of the flexible datacenters.

\* \* \* \* \*